US012451055B2

(12) United States Patent
Lee et al.

(10) Patent No.: US 12,451,055 B2
(45) Date of Patent: Oct. 21, 2025

(54) DISPLAY DEVICE CAPABLE OF ADJUSTING RESOLUTION AND GRAYSCALE

(71) Applicant: LG Display Co., Ltd., Seoul (KR)

(72) Inventors: Junhyeok Lee, Seoul (KR); YoungIn Jang, Seoul (KR); Soyoung Lee, Seoul (KR); HyunGon Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/653,715

(22) Filed: May 2, 2024

(65) Prior Publication Data

US 2024/0420623 A1 Dec. 19, 2024

(30) Foreign Application Priority Data

Jun. 16, 2023 (KR) ........................ 10-2023-0077472

(51) Int. Cl.

| | |
|---|---|
| ***G09G 3/32*** | (2016.01) |
| ***G09G 3/20*** | (2006.01) |
| ***H10H 20/856*** | (2025.01) |
| ***H10H 29/14*** | (2025.01) |

(52) U.S. Cl.

CPC ............ *G09G 3/32* (2013.01); *G09G 3/2007* (2013.01); *H10H 20/856* (2025.01); *H10H 29/142* (2025.01); *G09G 2300/0426* (2013.01); *G09G 2300/0819* (2013.01); *G09G 2300/0852* (2013.01); *G09G 2300/0861* (2013.01); *G09G 2340/0407* (2013.01)

(58) Field of Classification Search

CPC ............................................... G09G 3/30–3291

See application file for complete search history.

(56) References Cited

U.S. PATENT DOCUMENTS

| | | | | |
|---|---|---|---|---|
| 9,558,690 | B2 | 1/2017 | Lee et al. | |
| 11,798,483 | B1 * | 10/2023 | Ha | G09G 3/3258 |
| 2014/0077725 | A1 * | 3/2014 | Lee | G09G 3/3225 315/312 |
| 2015/0248210 | A1 | 9/2015 | Lee et al. | |

FOREIGN PATENT DOCUMENTS

KR 10-2015-0102787 A 9/2015

* cited by examiner

*Primary Examiner* — Roy P Rabindranath
(74) *Attorney, Agent, or Firm* — Fenwick & West LLP

(57) ABSTRACT

A display device includes a display panel in which a plurality of first pixel areas and a plurality of second pixel areas each including a plurality of sub pixels are defined; a pixel circuit which is disposed in each of the plurality of sub pixels and includes a driving transistor; and a welding transistor which selectively connects the pixel circuits of the first pixel area and a second pixel area which are adjacent to each other, among the plurality of first pixel areas and the plurality of second pixel areas. Accordingly, the welding transistor is used to further supply a driving current of the pixel circuit to the light emitting diode of an adjacent sub pixel to improve the luminance.

19 Claims, 14 Drawing Sheets

DISPLAY DEVICE CAPABLE OF ADJUSTING RESOLUTION AND GRAYSCALE

CROSS-REFERENCE TO RELATED APPLICATION

This application claims the priority benefit of Republic of Korea Patent Application No. 10-2023-0077472 filed on Jun. 16, 2023, in the Korean Intellectual Property Office, the entire contents of which are hereby expressly incorporated herein for all purposes.

BACKGROUND

Technical Field

The present disclosure relates to a display device, and more particularly, for example, without limitation, to a display device using a light emitting diode (LED).

Description of the Related Art

As display devices which are used for a monitor of a computer, a television, or a cellular phone, there are an organic light emitting display device (OLED) which is a self-emitting device, a plasma display device (PDP), a field emission display device (FED), a micro LED (Micro Light Emitting Diode) display device, and a liquid crystal display device (LCD) which requires a separate light source, etc.

An applicable range of the display device is diversified to personal digital assistants as well as monitors of computers and televisions and a display device with a large display area and a reduced volume and weight is being studied.

Further, recently, a display device including a light emitting diode (LED) is attracting attention as a next generation display device. Since the LED is formed of an inorganic material, rather than an organic material, reliability is excellent so that a lifespan thereof is longer than that of the liquid crystal display device or the organic light emitting display device. Further, the LED has a fast lighting speed, excellent luminous efficiency, and a strong impact resistance so that a stability is excellent and an image having a high luminance may be displayed.

The description provided in the description of the related art section should not be assumed to be prior art merely because it is mentioned in or associated with the description of the related art section. The description of the related art section may include information that describes one or more aspects of the subject technology, and the description in this section does not limit the invention.

SUMMARY

The inventors have recognized requirements and limitations on resolution of a display device. Accordingly, an object to be achieved by the present disclosure is to provide a display device which is capable of being driven in both a high resolution mode and a low resolution mode.

Another object to be achieved by the present disclosure is to provide a display device which is capable of being driven in both a high gray scale mode and a low gray scale mode in a low resolution model display device.

Still another object to be achieved by the present disclosure is to provide a display device which is implemented as a low resolution model from a display device designed with respect to a high resolution.

Still another object to be achieved by the present disclosure is to provide a display device which is capable of adjusting a resolution according to a specification of a tiling display device.

Still another object to be achieved by the present disclosure is to provide a display device in which a display device exclusive for a high resolution mode and a display device exclusive for a low resolution mode are unified to reduce a manufacturing cost and a process time.

Still another object to be achieved by the present disclosure is to provide a display device which selectively transfers a light emitting diode to only some sub pixels of the plurality of sub pixels to be driven at a low resolution.

Still another object to be achieved by the present disclosure is to provide a display device which is capable of supplying a high current to a light emitting diode by connecting a pixel circuit of a sub pixel to which a light emitting diode is not transferred to a light emitting diode of another sub pixel in a low resolution model.

Still another object to be achieved by the present disclosure is to provide a display device which easily displays a high gray-scale image by supplying a high current to a light emitting diode in a low resolution model.

Objects of the present disclosure are not limited to the above-mentioned objects, and other objects, which are not mentioned above, can be clearly understood by those skilled in the art from the following descriptions.

According to an aspect of the present disclosure, a display device includes a display panel in which a plurality of first pixel areas and a plurality of second pixel areas each including a plurality of sub pixels are defined; a pixel circuit which is disposed in each of the plurality of sub pixels and includes a driving transistor; and a welding transistor which selectively connects the pixel circuits of the first pixel area and a second pixel area which are adjacent to each other, among the plurality of first pixel areas and the plurality of second pixel areas. Accordingly, the welding transistor is used to further supply a driving current of the pixel circuit to the light emitting diode of an adjacent sub pixel to improve the luminance.

According to another aspect of the present disclosure, a display device includes: a substrate in which a plurality of first pixel areas and a plurality of second pixel areas each including a plurality of sub pixels are defined; a plurality of pixel circuits which is disposed in each of the plurality of sub pixels on the substrate and includes a driving transistor; a plurality of reflection plates which is disposed in each of the plurality of sub pixels on the plurality of pixel circuits and is electrically connected to the driving transistor of each of the plurality of pixel circuits; and a plurality of welding transistors which is disposed between the plurality of first pixel areas and the plurality of second pixel areas and selectively connects the plurality of reflection plates of the plurality of first pixel areas and the plurality of reflection plates of the plurality of second pixel areas. Accordingly, the reflection plate connected to the driving transistor is used to easily electrically connect driving transistors of adjacent pixel circuits.

Other detailed matters of the exemplary embodiments are included in the detailed description and the drawings.

According to the present disclosure, the display device may be driven in any one of a high resolution mode and a low resolution mode.

According to the present disclosure, the display device may be driven in any one of a high gray scale mode and a low gray scale mode in a low resolution model display device.

According to the present disclosure, a resolution of the display device is easily adjusted according to a specification of a tiling display device.

According to the present disclosure, during the driving in a low resolution mode, a pixel circuit of a sub pixel which does not emit light is selectively connected to a light emitting diode to display an image with a high luminance.

According to the present disclosure, designs of the low resolution model display device and the high resolution model display device are unified to optimize the process and reduce a process time and a manufacturing cost.

According to the present disclosure, a light emitting diode is selectively transferred to only some sub pixels to easily form a low resolution model display device.

According to the present disclosure, a pixel circuit in an area where a light emitting diode is not transferred is selectively connected to the light emitting diode to easily display a high gray-scale image.

The effects according to the present disclosure are not limited to the contents exemplified above, and more various effects are included in the present disclosure.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

BRIEF DESCRIPTION OF THE DRAWINGS

The above and other aspects, features and other advantages of the present disclosure will be more clearly understood from the following detailed description taken in conjunction with the accompanying drawings, in which.

Figure 1:
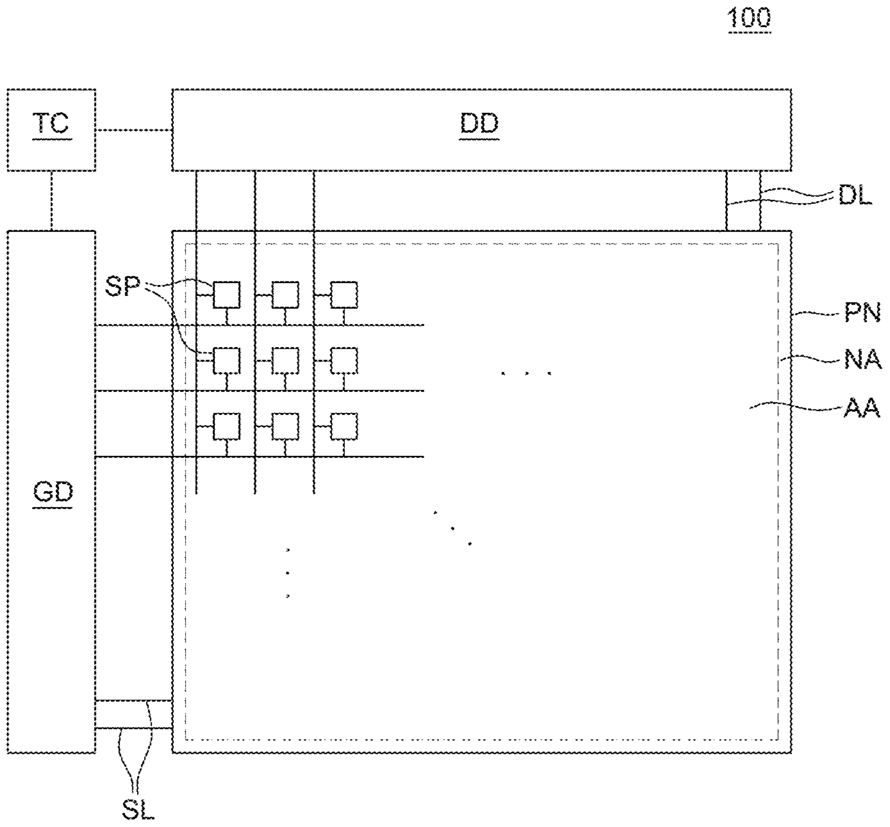
FIG. 1 is a schematic diagram of a display device according to an exemplary embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, areas, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted or may be briefly provided to avoid unnecessarily obscuring the subject matter of the present disclosure. The terms such as "include," "have," "comprise," "contain," "constitute," "make up of," "formed of," and "consist of" used herein are generally intended to allow other components to be added unless the terms are used with the term "only". Any references to singular may include plural unless expressly stated otherwise.

Any implementation described herein as an "example" is not necessarily to be construed as preferred or advantageous over other implementations.

When terms "comprise," "have," and "include" described in the present disclosure may be used, another part may be added unless a more limiting terms, such as "only," is used. The terms of a singular form may include plural forms unless referred to the contrary.

Components are interpreted to include an ordinary error range even if not expressly stated.

When the position relation between two parts is described using the terms such as "on", "above", "over", "below", "under", "beside", "beneath", "near", "close to," "adjacent to", "on a side of", "next", one or more parts may be positioned between the two parts unless the terms are used with the term "immediately" or "directly".

Spatially relative terms, such as "under," "below," "beneath", "lower," "over," "upper" and the like, may be used herein for ease of description to describe one element or feature's relationship to another element(s) or feature(s) as illustrated in the figures. It will be understood that the spatially relative terms can encompass different orientations of an element in use or operation in addition to the orientation depicted in the figures. For example, if an element in the figures is inverted, elements described as "below" or "beneath" other elements or features would then be oriented "over" the other elements or features. Thus, the exemplary term "below" can encompass both an orientation of below and above. Similarly, the exemplary term "above" or "over" can encompass both an orientation of "above" and "below".

In describing temporal relationship, terms such as "after," "subsequent to," "following," "next," "before," and the like may include cases where any two events are not consecutive, unless the term such as "immediately" "just" or "directly" is explicitly used.

When an element or layer is disposed "on" another element or layer, another layer or another element may be interposed directly on the other element or therebetween.

Although the terms "first", "second", "A", "B", "(a)", "(b)", and the like are used for describing various components, these components are not confined by these terms. These terms are merely used for distinguishing one component from the other components. Therefore, a first component to be mentioned below may be a second component in a technical concept of the present disclosure.

In addition, terms, such as first, second, A, B, (a), (b), or the like may be used herein when describing components of the present disclosure. Each of these terminologies is not used to define an essence, order, or sequence of a corresponding component but used merely to distinguish the corresponding component from other components. In the case that it is described that a certain structural element or layer is "connected", "coupled", "adhered" or "joined" to another structural element or layer, it is typically interpreted that another structural element or layer may be "connected", "coupled", "adhered" or "joined" to the structural element or layer directly or indirectly.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

A term "device" used herein may refer to a display device including a display panel and a driver for driving the display panel. Examples of the display device may include a light emitting diode (LED), and the like. In addition, examples of the device may include a notebook computer, a television, a computer monitor, an automotive device, a wearable device, and an automotive equipment device, and a set electronic device (or apparatus) or a set device (or apparatus), for example, a mobile electronic device such as a smartphone or an electronic pad, which are complete products or final products respectively including LED and the like, but embodiments of the present disclosure are not limited thereto.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein.

In the aspects of the present disclosure, a source electrode and a drain electrode are distinguished from each other, for convenience of description. However, the source electrode and the drain electrode are used interchangeably. The source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

Hereinafter, an embodiment of the present disclosure will be described in detail with reference to the drawings. For convenience of description, a scale of each of elements illustrated in the accompanying drawings differs from a real scale, and thus, is not limited to a scale illustrated in the drawings.

Figure 2A:
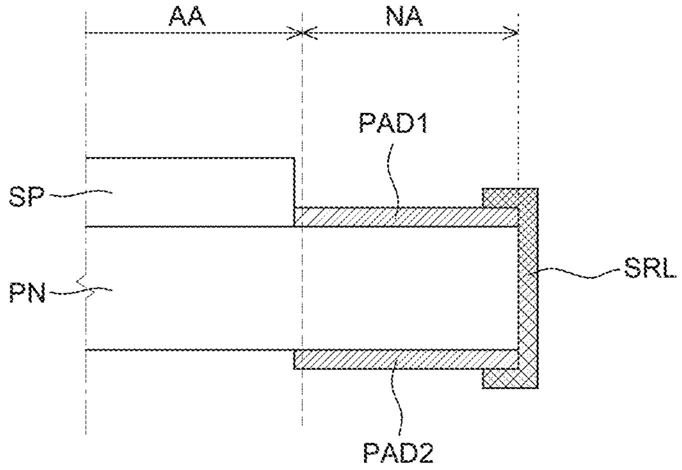
FIG. 2A is a partial cross-sectional view of a display device according to an exemplary embodiment of the present disclosure.
Figure 2B:
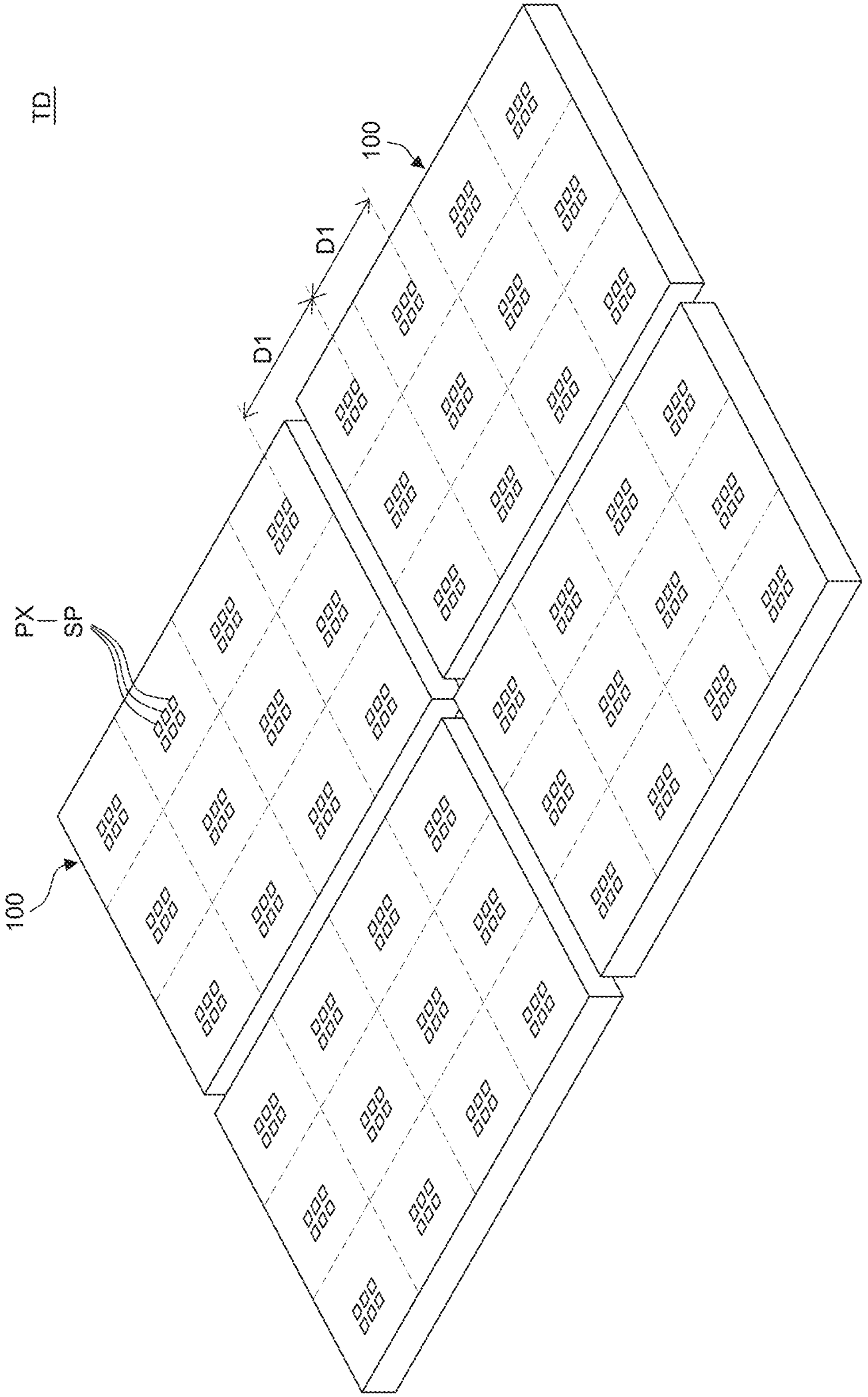
FIG. 2B is a perspective view of a tiling display device according to an exemplary embodiment of the present disclosure.

FIG. 1 is a schematic diagram of a display device according to an exemplary embodiment of the present disclosure. FIG. 2A is a partial cross-sectional view of a display device according to an exemplary embodiment of the present disclosure. FIG. 2B is a perspective view of a tiling display device according to an exemplary embodiment of the present disclosure. In FIG. 1, for the convenience of description, among various components of the display device 100, only a display panel PN, a gate driver GD, a data driver DD, and a timing controller TC are illustrated, but components of the display device 100 of the present disclosure are not limited thereto. Meanwhile, all the components of each display device according to all embodiments of the present disclosure are operatively coupled and configured.

Referring to FIG. 1, the display device 100 includes a display panel PN including a plurality of sub pixels SP, a gate driver GD and a data driver DD which supply various signals to the display panel PN, and a timing controller TC which controls the gate driver GD and the data driver DD.

The gate driver GD supplies a plurality of scan signals to a plurality of scan lines SL according to a plurality of gate control signals supplied from the timing controller TC. Even though in FIG. 1, it is illustrated that one gate driver GD is disposed to be spaced apart from one side of the display panel PN, the number of the gate drivers GD and the placement thereof are not limited thereto. For example, two gate drivers GDs may be disposed at two sides of the display panel PN, respectively, and be spaced apart from the display panel PN. However, Embodiments of the present disclosure are not limited thereto.

The data driver DD converts image data input from the timing controller TC into a data voltage using a reference gamma voltage in accordance with a plurality of data control signals supplied from the timing controller TC. The data driver DD may supply the converted data voltage to the plurality of data lines DL. The data driver DD may be embodied in the form of an Integrated Circuit (IC), or may be embodied in the display panel 110 in a Gate In Panel (GIP) type.

The timing controller TC aligns image data input from the outside to supply the image data to the data driver DD. The timing controller TC may generate a gate control signal and a data control signal using synchronization signals input from the outside, such as a dot clock signal, a data enable signal, and horizontal/vertical synchronization signals. Here, the horizontal synchronization signal is a signal representing a time taken to display one horizontal line of a screen and the vertical synchronization signal is a signal representing a time taken to display a screen of one frame. The data enable signal may correspond to a signal indicating a period for which a data voltage is supplied to the pixel PX. Further, the timing controller TC supplies the generated gate control signal and data control signal to the gate driver GD and the data driver DD, respectively, to control the gate driver GD and the data driver DD.

The display panel PN is a configuration which displays images to the user and includes the plurality of sub pixels SP. In the display panel PN, the plurality of scan lines SL and the plurality of data lines DL intersect each other and the plurality of sub pixels SP is connected to the scan lines SL and the data lines DL, respectively. In addition, even though it is not illustrated in the drawing, each of the plurality of sub pixels SP may be connected to a high potential power line, a low potential power line, and a reference line.

In the display panel PN, an active area AA and a non-active area NA disposed in the vicinity of the active area AA, surrounding the active area AA, or around the active area AA may be defined.

The active area AA is an area in which images are displayed in the display device 100. In the active area AA, a plurality of pixel regions may be arranged in a matrix form along a plurality of row and column lines. The plurality of pixel regions may include pixel regions displaying different colors, for example, red (R), green (G), and blue (B), or red (R), green (G), blue (B), and white (W). At this time, the red (R), green (G), and blue (B) pixel regions that are adjacent to each other or the red (R), green (G), blue (B), and white (W) pixel regions that are adjacent to each other may function as a unit pixel for displaying a color image. In the active area AA, a plurality of sub pixels SP which configures a plurality of pixels PX and a circuit for driving the plurality of sub pixels SP may be disposed. The plurality of sub pixels SP is a minimum unit which configures the active area AA and n sub pixels SP form one pixel PX. Each of the plurality of sub pixels SP may emit light having different wavelengths from each other. The plurality of sub pixels may include first to third sub pixels which emit different color light from each other. For example, the plurality of sub pixels SP may include a red sub pixel SPR which is a first sub pixel, a green sub pixel SPG which is a second sub pixel, and a blue sub pixel SPB which is a third sub pixel. Further, the plurality of sub pixels SP may also further include a white sub pixel.

For example, the plurality of sub pixels SP may include red, green, and blue sub-pixels, in which the red, green, and blue sub-pixels may be disposed in a repeated manner. Alternatively, the plurality of sub pixels SP may include red, green, blue, and white sub-pixels, in which the red, green, blue, and white sub-pixels may be disposed in a repeated manner, or the red, green, blue, and white sub-pixels may be disposed in a quad type. For example, the red sub pixel, the blue sub pixel, and the green sub pixel may be sequentially disposed along a row direction, or the red sub pixel, the blue sub pixel, the green sub pixel and the white sub pixel may be sequentially disposed along the row direction. However, in the example embodiment of the present disclosure, the color type, disposition type, and disposition order of the sub-pixels are not limiting, and may be configured in various forms according to light-emitting characteristics, device lifespans, and device specifications.

Meanwhile, the sub-pixels may have different light-emitting areas according to light-emitting characteristics. For example, a sub-pixel that emits light of a color different from that of a blue sub-pixel may have a different light-emitting area from that of the blue sub-pixel. For example, the red sub-pixel, the blue sub-pixel, and the green sub-pixel, or the red sub-pixel, the blue sub-pixel, the white sub-pixel, and the green sub-pixel may each has a different light-emitting area.

In each of the plurality of sub pixels SP, a light emitting diode and a thin film transistor for driving the light emitting diode may be disposed. The plurality of light emitting diodes may be defined in different manners depending on the type of the display panel PN. For example, when the display panel PN is an inorganic light emitting display panel PN, the light emitting diode may be a light emitting diode (LED) or a micro light emitting diode (micro LED), and when the display panel PN is an organic light emitting display panel, the light emitting element may be an organic light emitting diode (OLED), and embodiments of the present disclosure are not limited thereto.

In the active area AA, a plurality of wiring lines which transmits various signals to the plurality of sub pixels SP is disposed. For example, the plurality of wiring lines may include a plurality of data lines DL which supplies a data voltage to each of the plurality of sub pixels SP and a plurality of scan lines SL which supplies a scan signal to each of the plurality of sub pixels SP. The plurality of scan lines SL extends in one direction in the active area AA to be connected to the plurality of sub pixels SP and the plurality of data lines DL extends in a direction different from the one direction in the active area AA to be connected to the plurality of sub pixels SP. In addition, in the active area AA, a low potential power line and a high potential power line may be further disposed, but are not limited thereto.

One sub pixel SP constituting a unit pixel may include a switching thin film transistor SW, a driving thin film transistor DR, a storage capacitor Cst, a compensation circuit CC, and a light emitting diode EL.

The switching thin film transistor SW may perform a switching operation to store a data signal supplied through the first data line in the storage capacitor Cst as a data voltage in response to the scan signal supplied through the first gate line. The driving thin film transistor DR may operate to flow a driving current between a first power line (e.g., high potential voltage) and a second power line (e.g., low potential voltage) in accordance with the data voltage stored in the storage capacitor Cst. The light emitting diode EL may operate to emit light in accordance with the driving current formed by the driving thin film transistor DR.

The compensation circuit CC is a circuit added within the subpixel to compensate for a threshold voltage of the driving thin film transistor DR. The compensation circuit CC may include one or more thin film transistors. The compensation circuit CC may have various configurations in accordance with a compensation method and thus its example will be described as follows.

The non-active area NA is an area where images are not displayed so that the non-active area NA may be defined as an area extending from the active area AA. In the non-active area NA, a link line which transmits a signal to the sub pixel SP of the active area AA, a pad electrode, or a driving IC, such as a gate driver IC or a data driver IC, may be disposed.

However, the non-active area NA may be located on a rear surface of the display panel PN, that is, a surface on which the sub pixels SP are not disposed or may be omitted, and is not limited as illustrated in the drawing.

In the meantime, a driver, such as a gate driver GD, a data driver DD, and a timing controller TC, may be connected to the display panel PN in various ways. For example, the gate driver GD may be mounted in the non-active area NA in a gate in panel (GIP) manner or mounted between the plurality of sub pixels SP in the active area AA in a gate in active area (GIA) manner. For example, the data driver DD and the timing controller TC are formed in separate flexible film and printed circuit board. The data driver DD and the timing controller TC are electrically connected to the display panel PN by bonding the flexible film and the printed circuit board to the pad electrode formed in the non-active area NA of the display panel PN. However, embodiments of the present disclosure are not limited thereto.

If the gate driver GD is mounted in the GIP manner and the data driver DD and the timing controller TC transmit a signal to the display panel PN through a pad electrode of the non-active area NA, an area of the non-active area NA for disposing the gate driver GD and the pad electrode is necessary more than a predetermined level. Accordingly, a bezel may be increased.

In contrast, the gate driver GD is mounted in the active area AA in the GIA manner and a side line SRL which connects the signal line on the front surface of the display panel PN to the pad electrode on a rear surface of the display panel PN is formed to bond the flexible film and the printed circuit board onto a rear surface of the display panel PN. At this time, the non-active area NA may be minimized on the front surface of the display panel PN. That is, when the gate driver GD, the data driver DD, and the timing controller TC are connected to the display panel PN as described above, a zero bezel with substantially no bezel may be implemented or realized.

Specifically, referring to FIG. 2A and FIG. 2B, in the non-active area NA of the display panel PN, a plurality of pad electrodes for transmitting various signals to the plurality of sub pixels SP is disposed. For example, in a non-active area NA on the front surface of the display panel PN, a first pad electrode PAD1 which transmits a signal to the plurality of sub pixels SP is disposed. In a non-active area NA on the rear surface of the display panel PN, a second pad electrode PAD2 which is electrically connected to a driving component, such as a flexible film and the printed circuit board, is disposed. That is, on the front surface of the display panel PN on which images are displayed, only a pad area of the non-active area NA in which the first pad electrode PAD1 is disposed may be formed at minimum.

In this case, even though it is not illustrated in the drawing, various signal lines connected to the plurality of sub pixels SP, for example, a scan line SL or a data line DL extends from the active area AA to the non-active area NA to be electrically connected to the first pad electrode PAD1.

Further, the side line SRL is disposed along a side surface of the display panel PN. The side line SRL may electrically connect the first pad electrode PAD1 on the front surface of the display panel PN and the second pad electrode PAD2 on the rear surface of the display panel PN. Therefore, a signal from a driving component on the rear surface of the display panel PN may be transmitted to the plurality of sub pixels SP through the second pad electrode PAD2, the side line SRL, and the first pad electrode PAD1. Accordingly, a signal transmitting path from the front surface of the display panel PN to the side surface and the rear surface is formed to minimize an area of the non-active area NA on the front surface of the display panel PN.

Referring to FIG. 2B, a tiling display device TD having a large screen size may be implemented by connecting a plurality of display devices 100. At this time, as illustrated in FIG. 2A, when the tiling display device TD is implemented using a display device 100 with a minimized bezel, a seam area in which an image between the display devices 100 is not displayed is minimized so that a display quality may be improved.

For example, the plurality of sub pixels SP forms one pixel PX and a distance D1 between an outermost pixel PX of one display device 100 and an outermost pixel PX of another display device 100 adjacent to one display device may be implemented to be equal to a distance D1 between pixels PX in one display device 100. Accordingly, a constant distance D1 between pixels PX between the display devices 100 is configured to minimize the seam area.

However, FIG. 2A and FIG. 2B are illustrative so that the display device 100 according to the exemplary embodiment of the present disclosure may be a general display device with a bezel, but is not limited thereto.

Figure 3:
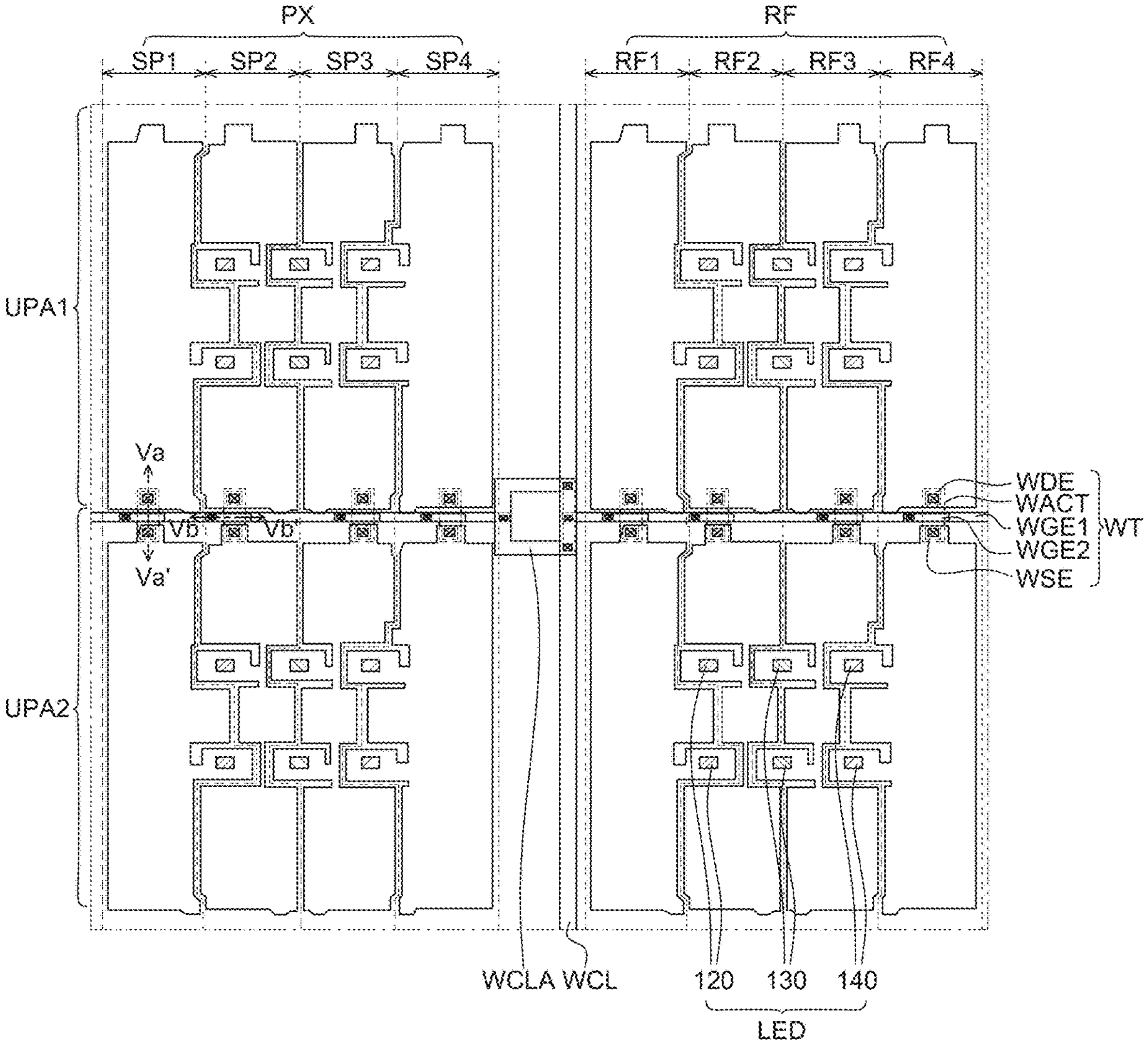
FIG. 3 is an enlarged plan view of a display panel of a display device according to an exemplary embodiment of the present disclosure.
Figure 4:
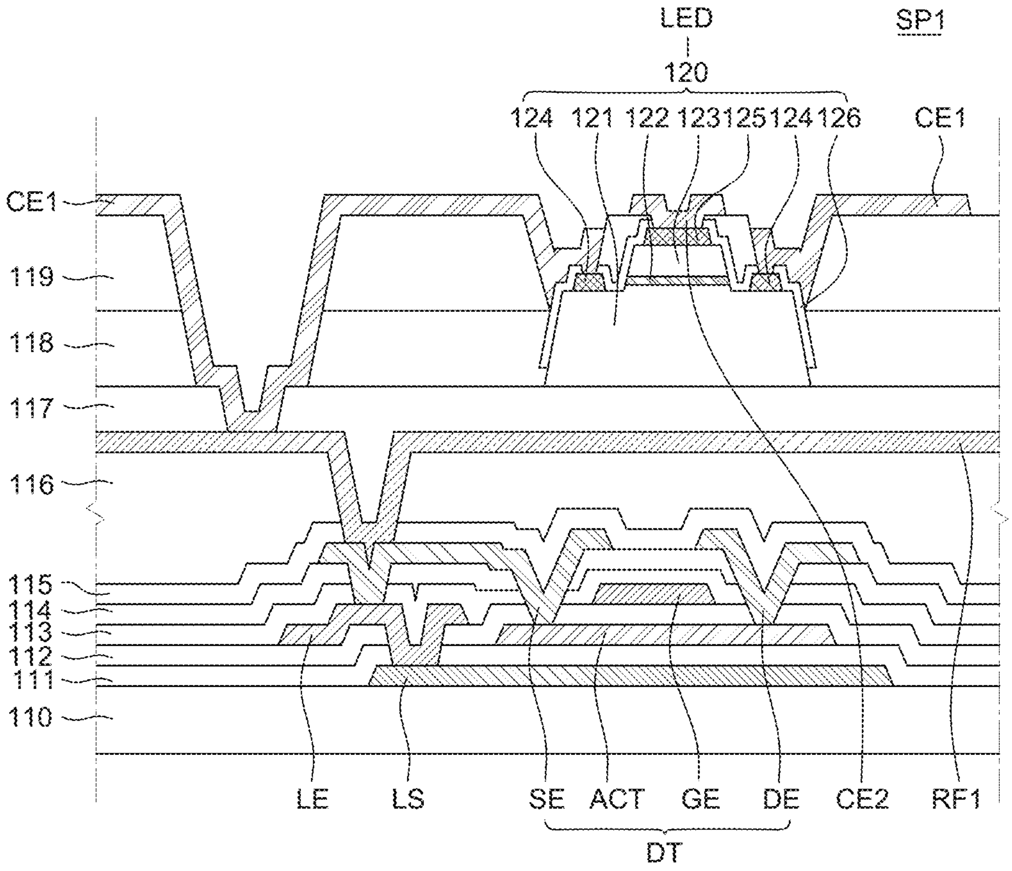
FIG. 4 is a cross-sectional view of a sub pixel of a display device according to an exemplary embodiment of the present disclosure.
Figure 5A:
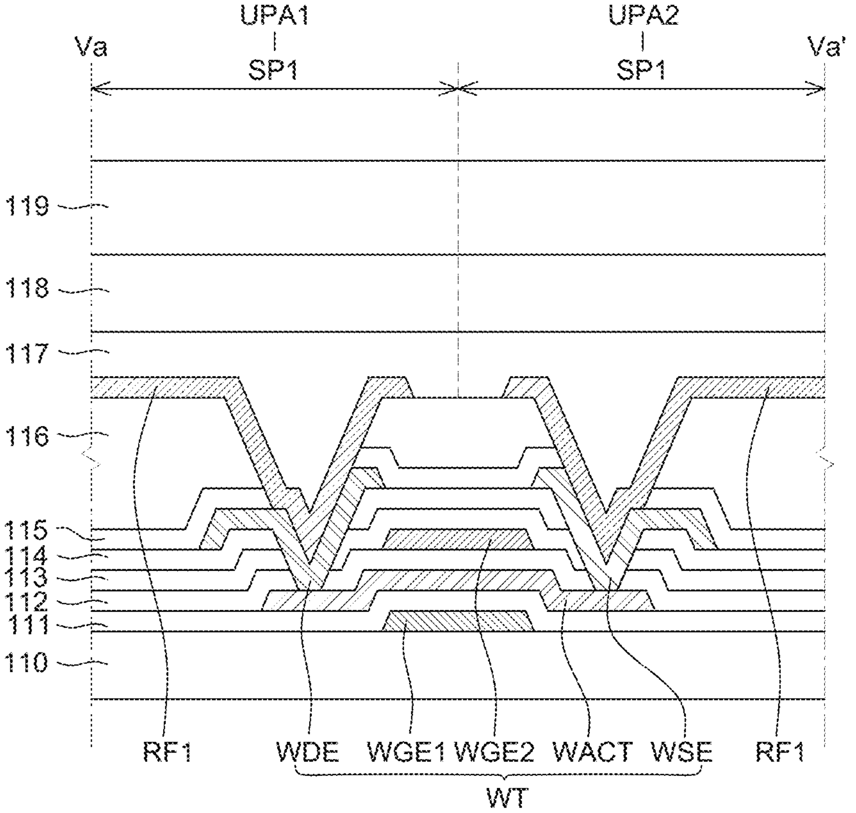
FIG. 5A is a cross-sectional view taken along the line Va-Va' of FIG. 3.
Figure 5B:
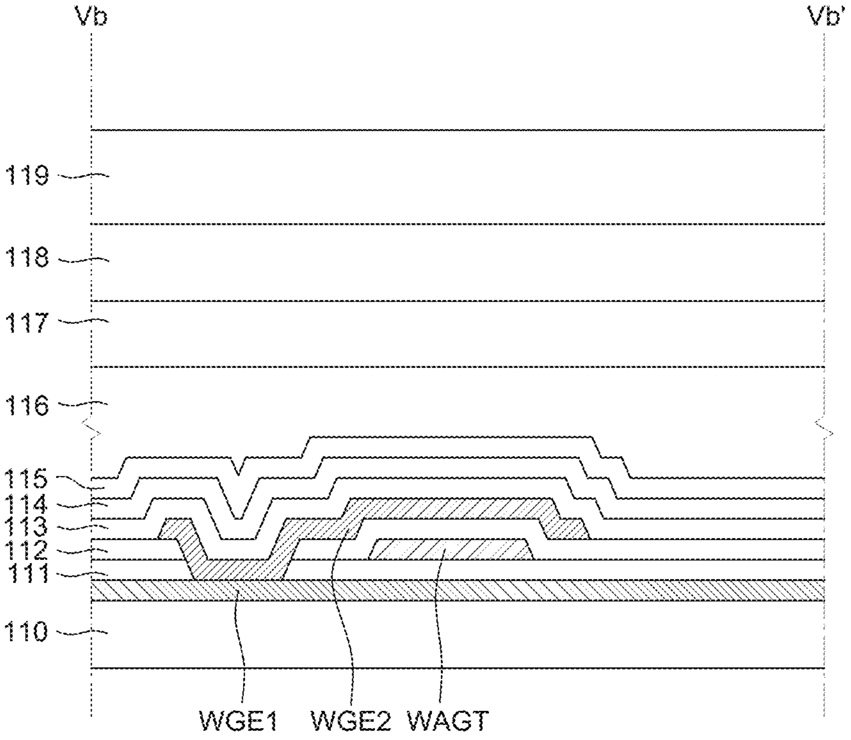
FIG. 5B is a cross-sectional view taken along Vb-Vb' of FIG. 3.

FIG. 3 is an enlarged plan view of a display panel of a display device according to an exemplary embodiment of the present disclosure. FIG. 4 is a cross-sectional view of a sub pixel of a display device according to an exemplary embodiment of the present disclosure. FIG. 5A is a cross-sectional view taken along the line Va-Va' of FIG. 3. FIG. 5B is a cross-sectional view taken along Vb-Vb' of FIG. 3. Specifically, FIG. 5A and FIG. 5B are cross-sectional views of a welding transistor WT according to an exemplary embodiment of the present disclosure. For the convenience of description, in FIG. 3, only a plurality of reflection plates RF, a plurality of light emitting diodes LED, and a plurality of welding transistors WT are illustrated and in FIG. 4, only a driving transistor among configurations of a pixel circuit PC is illustrated.

First, the display device 100 according to an exemplary embodiment of the present disclosure may be driven in any one of a high resolution mode and a low resolution mode. In the high resolution mode, all the plurality of pixels PX is driven to display a high resolution image and in the low resolution mode, only some of the plurality of pixels PX is driven to display a low resolution image. The resolution varies depending on the number of pixels PX used to display one image. Therefore, a resolution of an image to be displayed may be adjusted by selectively driving the plurality of pixels PX. For example, as the number of pixels PX being driven increases, the resolution of the image to be displayed increases.

Referring to FIG. 3, a plurality of pixel areas UPA is formed in the display panel PN. The plurality of pixel areas UPA is areas in which the plurality of pixels PX is disposed. The plurality of pixel areas UPA may be disposed by forming a plurality of rows and a plurality of columns. Each of the plurality of pixels PX disposed in the plurality of pixel areas UPA includes a plurality of sub pixels SP. Each of the plurality of sub pixels SP includes a light emitting diode LED and a pixel circuit PC to independently emit light.

The plurality of pixel areas UPA includes a plurality of first pixel areas UPA1 and a plurality of second pixel areas UPA2. When the display device 100 is driven, the plurality of first pixel areas UPA1 is always driven. That is, the plurality of first pixel areas UPA1 is areas in which images are always displayed in both the high resolution mode and the low resolution mode. The plurality of second pixel areas UPA2 is selectively driven when the display device 100 is driven, and the plurality of second pixel areas UPA2 is driven in a high resolution mode, but is not driven in a low resolution mode. For example, in the high resolution mode, both the plurality of first pixel areas UPA1 and the plurality of second pixel areas UPA2 are driven, and in the low resolution mode, only the plurality of first pixel areas UPA1 is driven, but the plurality of second pixel areas UPA2 is not driven. However, the present disclosure is not limited thereto, only the plurality of second pixel areas UPA2 may also be driven.

The placement of the plurality of first pixel areas UPA1 and the plurality of second pixel areas UPA2 may be designed in various forms according to the resolution. For example, the plurality of first pixel areas UPA1 and the plurality of second pixel areas UPA2 may be alternately disposed in the row direction and the column direction or alternately disposed in any one of the row direction and the column direction. Even though in FIG. 3, it is illustrated that the first pixel area UPA1 and the second pixel area UPA2 are disposed in different rows, it is illustrative and the present disclosure is not limited thereto, for example, the first pixel area UPA1 and the second pixel area UPA2 are disposed in different columns.

The plurality of sub pixels SP which forms one pixel PX is disposed in each of the plurality of pixel areas UPA. For example, the plurality of sub pixels SP may include a first sub pixel SP1, a second sub pixel SP2, a third sub pixel SP3, and a fourth sub pixel SP4 which emit different color light. For example, the first sub pixel SP1 and the second sub pixel SP2 are red sub pixels, the third sub pixel SP3 is a green sub pixel, and the fourth sub pixel SP4 is a blue sub pixel, but it is not limited thereto.

Hereinafter, the description will be made by assuming that one pixel PX includes one first sub pixel SP1, one second sub pixel SP2, one third sub pixel SP3, and one fourth sub pixel SP4, that is, two red sub pixels, one green sub pixel, and one blue sub pixel. However, the configuration of the pixel PX is not limited thereto.

Referring to FIG. 3 and FIG. 4 together, in each of the plurality of sub pixels SP of the display panel PN of the display device 100 according to the exemplary embodiment of the present disclosure, a substrate 110, a buffer layer 111, a gate insulating layer 112, a first interlayer insulating layer 113, a second interlayer insulating layer 114, a third interlayer insulating layer 115, a first planarization layer 116, an adhesive layer 117, a second planarization layer 118, a third planarization layer 119, a driving transistor DT, a light emitting diode LED, a plurality of reflection plates RF, a first connection electrodes CE1, a second connection electrodes CE2, a light shielding layer LS, and an auxiliary electrode LE are disposed.

First, the substrate 110 is a component for supporting various components included in the display device 100 and may be formed of an insulating material. For example, the substrate 110 may be formed of glass or resin. Further, the substrate 110 may be configured to include polymer or plastics or may be formed of a material having flexibility. For example, the substrate 110 may be made of a flexible polymer film. For example, the flexible polymer film may be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC), polyvinyl alcohol (PVA), and polystyrene (PS), and the present disclosure is not limited thereto.

The light shielding layer LS is disposed in each of the plurality of sub pixels SP on the substrate 110. The light shielding layer LS blocks light incident onto a driving active layer ACT of the driving transistor DT to be described below, below the substrate 110. Light which is incident onto the driving active layer ACT of the driving transistor DT is blocked by the light shielding layer LS to minimize a leakage current.

The buffer layer 111 is disposed on the substrate 110 and the light shielding layer LS. The buffer layer 111 may reduce permeation of moisture or impurities through the substrate 110. The buffer layer 111 may be configured by a single layer or a double layer of silicon oxide (SiOx) or silicon nitride (SiNx), but is not limited thereto. For example, the buffer layer 111 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto. However, the buffer layer 111 may be omitted depending on a type of substrate 110 or a type of transistor, but is not limited thereto.

A pixel circuit PC including the driving transistor DT is disposed on the substrate 110. The pixel circuit PC is a circuit which includes the driving transistor DT, some other transistors and a capacitor to drive a light emitting diode LED. For example, the pixel circuit PC may further include the driving transistor DT, a switching transistor, a sensing transistor, and an emission control transistor to supply a driving current to the light emitting diode LED. The transistors other than the driving transistor DT, among the plurality of transistors included in the pixel circuit PC and the capacitor may be configured in various forms depending on the design and the present disclosure is not limited thereto.

The driving transistor DT is disposed on the buffer layer 111. The driving transistor DT includes a driving active layer ACT, a driving gate electrode GE, a driving source electrode SE, and a driving drain electrode DE.

The driving active layer ACT is disposed on the buffer layer 111. The driving active layer ACT may be formed of a semiconductor material, such as an oxide semiconductor, amorphous semiconductor, or polycrystalline semiconductor, but is not limited thereto.

The oxide semiconductor material may have an excellent effect of preventing a leakage current and relatively inexpensive manufacturing cost. The oxide semiconductor may be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto.

The polycrystalline semiconductor material has a fast movement speed of carriers such as electrons and holes and thus has high mobility, and has low energy power consumption and superior reliability. The polycrystalline semiconductor may be made of polycrystalline silicon (poly-Si), but is not limited thereto.

The amorphous semiconductor material may be made of amorphous silicon (a-Si), but is not limited thereto.

Further, even though it is not illustrated in the drawings, another transistors, such as a switching transistor, a sensing transistor, and an emission control transistor, other than the driving transistor DT, may be further disposed on the buffer layer 111. The active layers of the transistors are also formed of a semiconductor material, such as an oxide semiconductor, amorphous silicon, or polysilicon. Further, the active layer of the transistor included in the pixel circuit PC, such as the driving transistor DT, the switching transistor, the sensing transistor, and the emission control transistor, may be formed of the same material, or formed of different materials.

Next, the gate insulating layer 112 is disposed on the driving active layer ACT. The gate insulating layer 112 is an insulating layer which insulates the driving active layer ACT from the driving gate electrode GE and may be configured by a single layer or a double layer of silicon oxide (SiOx) or silicon nitride (SiNx), but is not limited thereto. For example, the gate insulating layer 112 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

The driving gate electrode GE is disposed on the gate insulating layer 112. The driving gate electrode GE may be configured by a conductive material, such as copper (Cu), aluminum (Al), molybdenum (Mo), nickel (Ni), titanium (Ti), chrome (Cr), or an alloy thereof, but is not limited thereto. As an example, the driving gate electrode GE may be made of an alloy of two or more of them, or a plurality of layers thereof, but is not limited thereto.

The first interlayer insulating layer 113 and the second interlayer insulating layer 114 are disposed on the driving gate electrode GE. In the first interlayer insulating layer 113 and the second interlayer insulating layer 114, a contact hole through which the driving source electrode SE and the driving drain electrode DE are connected to the driving active layer ACT is formed. The first interlayer insulating layer 113 and the second interlayer insulating layer 114 are insulating layers for protecting a component below the first interlayer insulating layer 113 and the second interlayer insulating layer 114 and may be configured by a single layer or a double layer of silicon oxide (SiOx) or silicon nitride (SiNx), but are not limited thereto. For example, each of the first interlayer insulating layer 113 and the second interlayer insulating layer 114 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

The driving source electrode SE and the driving drain electrode DE which are electrically connected to the driving active layer ACT are disposed on the second interlayer insulating layer 114. The driving source electrode SE and the driving drain electrode DE may be configured by a conductive material, such as copper (Cu), aluminum (Al), molybdenum (Mo), nickel (Ni), titanium (Ti), chrome (Cr), or an alloy thereof, but are not limited thereto.

In the meantime, in the present disclosure, it is described that the first interlayer insulating layer 113 and the second interlayer insulating layer 114, that is, a plurality of insulating layers is disposed between the driving gate electrode GE and the driving source electrode SE and the driving drain electrode DE. However, the present disclosure is not limited thereto, only one insulating layer may be disposed between the driving gate electrode GE and the driving source electrode SE and the driving drain electrode DE.

Further, as illustrated in the drawings, when a plurality of insulating layers, such as the first interlayer insulating layer 113 and the second interlayer insulating layer 114, is disposed between the driving gate electrode GE and the driving source electrode SE and the driving drain electrode DE, an electrode may be further formed between the first interlayer insulating layer 113 and the second interlayer insulating layer 114. The additionally formed electrode may form a capacitor with the other configuration disposed below first interlayer insulating layer 113 or above the second interlayer insulating layer 114.

The auxiliary electrode LE is disposed on the gate insulating layer 112. The auxiliary electrode LE is an electrode which electrically connects the light shielding layer LS below the buffer layer 111 to any one of the driving source electrode SE and the driving drain electrode DE on the second interlayer insulating layer 114. For example, the light shielding layer LS is electrically connected to any one of the driving source electrode SE or the driving drain electrode DE through the auxiliary electrode LE so as not to operate as a floating gate. Therefore, fluctuation of a threshold voltage of the driving transistor DT caused by the floated light shielding layer LS may be minimized. Even though in the drawing, the light shielding layer LS is connected to the driving source electrode SE, the light shielding layer LS may also be connected to the driving drain electrode DE, but is not limited thereto.

The third interlayer insulating layer 115 is disposed on the driving transistor DT. The third interlayer insulating layer 115 is disposed so as to cover the pixel circuit PC including the driving transistor DT to protect the pixel circuit PC. The third interlayer insulating layer 115 may be configured by a single layer or a double layer of silicon oxide (SiOx) or silicon nitride (SiNx), but is not limited thereto. For example, third interlayer insulating layer 115 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

The first planarization layer 116 is disposed on the third interlayer insulating layer 115. The first planarization layer 116 may planarize an upper portion of the substrate 110 on which the driving transistor DT is disposed. The first planarization layer 116 may be configured by a single layer or a double layer, and for example, may be formed of photoresist or an acrylic-based organic material, but is not limited thereto.

Referring to FIG. 3 and FIG. 4 together, a plurality of reflection plates RF is disposed on the first planarization layer 116. The reflection plate RF is a configuration which reflects light emitted from the plurality of light emitting diodes LED above the substrate 110 and may be formed with a shape corresponding to each of the plurality of sub pixels SP. One reflection plate RF may be disposed to cover the most area of one sub pixel SP. The reflection plate RF reflects the light emitted from the light emitting diode LED and may be also used as an electrode which electrically connects the light emitting diode LED and the pixel circuit PC. Therefore, the reflection plate RF may include various conductive layers in consideration of a light reflection efficiency and a resistance. For example, the reflection plate RF may use an opaque conductive layer such as silver (Ag), aluminum (Al), molybdenum (Mo), titanium (Ti), or an alloy thereof and a transparent conductive layer such as indium tin oxide (ITO) or indium zinc oxide (IZO), but the structure of the reflection plate RF is not limited thereto.

The reflection plate RF includes a first reflection plate RF1 corresponding to the first sub pixel SP1, a second reflection plate RF2 corresponding to the second sub pixel SP2, a third reflection plate RF3 corresponding to the third sub pixel SP3, and a fourth reflection plate RF4 corresponding to the fourth sub pixel SP4.

The first reflection plate RF1 overlaps the first sub pixel SP1. The first reflection plate RF1 may reflect light emitted from the red light emitting diode 120 of the first sub pixel SP1 above the red light emitting diode 120. Further, the first reflection plate RF1 is electrically connected to the driving transistor DT through a contact hole formed in the first planarization layer 116 and the third interlayer insulating layer 115 to transmit a driving current from the driving transistor DT to the red light emitting diode 120.

The second reflection plate RF2 overlaps the second sub pixel SP2. The second reflection plate RF2 may reflect light emitted from the red light emitting diode 120 of the second sub pixel SP2 above the red light emitting diode 120. Further, the second reflection plate RF2 is electrically connected to the driving transistor DT through a contact hole formed in the first planarization layer 116 and the third interlayer insulating layer 115 to transmit a driving current from the driving transistor DT to the red light emitting diode 120.

The third reflection plate RF3 overlaps the third sub pixel SP3. The third reflection plate RF3 may reflect light emitted from the green light emitting diode 130 of the third sub pixel SP3 above the green light emitting diode 130. The third reflection plate RF3 is electrically connected to the driving transistor DT through a contact hole formed in the first planarization layer 116 and the third interlayer insulating layer 115 to transmit a driving current from the driving transistor DT to the green light emitting diode 130.

The fourth reflection plate RF4 overlaps the fourth sub pixel SP4. The fourth reflection plate RF4 may reflect light emitted from the blue light emitting diode 140 of the fourth sub pixel SP4 above the blue light emitting diode 140. The fourth reflection plate RF4 is electrically connected to the driving transistor DT through a contact hole formed in the first planarization layer 116 and the third interlayer insulating layer 115 to transmit a driving current from the driving transistor DT to the blue light emitting diode 140.

The adhesive layer 117 is disposed on the plurality of reflection layers RF. The adhesive layer 117 is formed on the front surface of the substrate 110 to fix the light emitting diode LED disposed on the adhesive layer 117. The adhesive layer 117 may be formed of a photo curable adhesive material which is cured by light. For example, the adhesive layer 117 may be selected from any one of adhesive polymer, epoxy resist, UV resin, polyimide, acrylate, urethane, and polydimethylsiloxane (PDMS), but is not limited thereto.

In the meantime, even though it is not illustrated in the drawing, a first passivation layer may be further disposed between the adhesive layer 117 and the plurality of reflection plates RF. The first passivation layer is an insulating layer which protects components below the first passivation layer and may be configured by a single layer or a double layer of silicon oxide (SiOx) or silicon nitride (SiNx), but is not limited thereto. For example, the first passivation layer may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

Meanwhile, a second passivation layer may be disposed on the plurality of reflection plates RF. The second passivation layer is an insulating layer for protecting components under the second passivation layer and may be formed of a single layer or multiple layers of silicon oxide (SiOx) or silicon nitride (SiNx), but is not limited thereto. For example, the second passivation layer 117 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

The plurality of light emitting diodes LED is disposed in each of the plurality of sub pixels SP on the adhesive layer 117. The light emitting diode LED is an element which emits light by a current. The light emitting diode LED includes a red light emitting diode 120 which emits red light, a green light emitting diode 130 which emits green light, and a blue light emitting diode 140 which emits blue light and implements light with various colors including white by a combination thereof. For example, the light emitting diode LED may be a light emitting diode (LED) or a micro LED, but is not limited thereto.

One red light emitting diode 120 is disposed in each of the first sub pixel SP1 and the second sub pixel SP2, one pair of green light emitting diodes 130 is disposed in the third sub pixel SP3, and one pair of blue light emitting diodes 140 is disposed in the fourth sub pixel SP4. That is, two red light emitting diodes 120, two green light emitting diodes 130, and two blue light emitting diodes 140 may be disposed in one pixel PX. At this time, each of the red light emitting diodes 120 is connected to the driving transistor DT of each of the first sub pixel SP1 and the second sub pixel SP2 respectively to be individually driven. In contrast, one pair of green light emitting diodes 130 of the third sub pixel SP3 and one pair of blue light emitting diodes 140 of the fourth sub pixel SP4 are connected to one driving transistor DT in parallel respectively to be driven. For example, one pair of green light emitting diodes 130 of the third sub pixel SP3 is connected to one driving transistor DT in parallel to be driven, and one pair of blue light emitting diodes 140 of the fourth sub pixel SP4 are connected to one driving transistor DT in parallel to be driven.

Hereinafter, the red light emitting diode 120 disposed in the first sub pixel SP1 will be described as an example, and the green light emitting diode 130 and the blue light emitting diode 140 are also formed by substantially the same configuration as the red light emitting diode.

Among the plurality of light emitting diodes LED, the red light emitting diode 120 includes a first semiconductor layer 121, an emission layer 122, a second semiconductor layer 123, a first electrode 124, and a second electrode 125.

The first semiconductor layer 121 is disposed on the adhesive layer 117 and the second semiconductor layer 123 is disposed on the first semiconductor layer 121. The first semiconductor layer 121 and the second semiconductor layer 123 may be layers formed by doping n-type and p-type impurities into a specific material. For example, the first semiconductor layer 121 and the second semiconductor layer 123 may be layers doped with n-type and p-type impurities into a material such as gallium nitride (GaN), indium aluminum phosphide (InAlP), or gallium arsenide (GaAs). The p-type impurity may be magnesium (Mg), zinc (Zn), and beryllium (Be), and the n-type impurity may be silicon (Si), germanium (Ge), and tin (Sn), but is not limited thereto.

The emission layer 122 is disposed between the first semiconductor layer 121 and the second semiconductor layer 123. The emission layer 122 is supplied with holes and electrons from the first semiconductor layer 121 and the second semiconductor layer 123 to emit light. The emission layer 122 may be formed by a single layer or a multi-quantum well (MQW) structure, and for example, may be formed of indium gallium nitride (InGaN) or gallium nitride (GaN), but is not limited thereto.

The first electrode 124 is disposed on the first semiconductor layer 121. The first electrode 124 is an electrode which electrically connects the driving transistor DT and the first semiconductor layer 121. In this case, the first semiconductor layer 121 is a semiconductor layer doped with an n-type impurity and the first electrode 124 may be a cathode. The first electrode 124 may be disposed on a top surface of the first semiconductor layer 121 which is exposed from the light emitting layer 122, and the second semiconductor layer 123. The first electrode 124 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

The second electrode 125 is disposed on the second semiconductor layer 123. The second electrode 125 may be disposed on the top surface of the second semiconductor layer 123. The second electrode 125 is an electrode which electrically connects any one of the high potential power line VDD or a low potential power line VSS and the second semiconductor layer 123. In this case, the second semiconductor layer 123 is a semiconductor layer doped with a p-type impurity and the second electrode 125 may be an anode. The second electrode 125 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

Next, an encapsulation layer 126 which encloses the first semiconductor layer 121, the emission layer 122, the second semiconductor layer 123, the first electrode 124, and the second electrode 125 is disposed. The encapsulation layer 126 is formed of an insulating material to protect the first semiconductor layer 121, the emission layer 122, and the second semiconductor layer 123. In the encapsulation layer 126, a contact hole which exposes the first electrode 124 and the second electrode 125 is formed to electrically connect a first connection electrode CE1 and a second connection electrode CE2 to the first electrode 124 and the second electrode 125.

In the meantime, a part of the side surface of the first semiconductor layer 121 may be exposed from the encapsulation layer 126. The light emitting diode LED manufactured on the wafer is separated from the wafer to be transferred onto the display panel PN. However, during the process of separating the light emitting diode LED from the wafer, a part of the encapsulation layer 126 may be torn. For example, a part of the encapsulation layer 126 which is adjacent to a lower edge of the first semiconductor layer 121 of the light emitting diode LED is torn during the process of separating the light emitting diode LED from the wafer. Accordingly, a part of a lower side surface of the first semiconductor layer 121 may be exposed to the outside. Even though the lower portion of the light emitting diode LED is exposed from the encapsulation layer 126, the first connection electrode CE1 and the second connection electrode CE2 are formed after forming the second planarization layer 118 and the third planarization layer 119 which cover the side surface of the first semiconductor layer 121. Accordingly, a short defect may be reduced.

Next, the second planarization layer 118 and the third planarization layer 119 are disposed over the adhesive layer 117 and the light emitting diode LED.

The second planarization layer 118 overlaps a part of side surfaces of the plurality of light emitting diodes LED to fix and protect the plurality of light emitting diodes LED. A torn part of the encapsulation layer 126 which protects the side surface of the first semiconductor layer 121 of the light emitting diode LED is covered by the second planarization layer 118. By doing this, contacts and short defects of the connection electrodes and the first semiconductor layer 121 may be suppressed thereafter.

The third planarization layer 119 is formed to cover upper portions of the second planarization layer 118 and the light emitting diode LED. A contact hole which exposes the first electrode 124 and the second electrode 125 of the light emitting diode LED may be formed in the third planarization layer 119. The first electrode 124 and the second electrode 125 of the light emitting diode LED are exposed from the third planarization layer 119 and the third planarization layer 119 is partially disposed in an area between the first electrode 124 and the second electrode 125 to reduce a short defect. The second planarization layer 118 and the third planarization layer 119 may be configured by a single layer or a double layer, and for example, may be formed of photo resist or an acrylic-based organic material, but is not limited thereto.

The first connection electrode CE1 and the second connection electrode CE2 are disposed on the third planarization layer 119. The second connection electrode CE2 is an electrode which electrically connects the second electrode 125 of the light emitting diode LED and the power line. The second connection electrode CE2 is electrically connected to the second electrode 125 of the light emitting diode LED through a contact hole formed in the third planarization layer 119. However, embodiments of the present disclosure are not limited thereto.

The first connection electrode CE1 is an electrode which electrically connects the first electrode 124 of the light emitting diode LED and the driving transistor DT. The first connection electrode CE1 may be connected to the first reflection plate RF1, the second reflection plate RF2, the third reflection plate RF3, and the fourth reflection plate RF4 of each of the plurality of sub pixels SP through contact holes. The contact holes are formed in the third planarization layer 119, the second planarization layer 118, and the adhesive layer 117. At this time, the first reflection plate RF1, the second reflection plate RF2, the third reflection plate RF3, and the fourth reflection plate RF4 are also connected to the driving source electrode SE of the driving transistor DT so that the driving source electrode SE of the driving transistor DT and the first electrode 124 of the light emitting diode LED may be electrically connected to each other. However, embodiments of the present disclosure are not limited thereto.

In the meantime, in the drawing, it is illustrated that the driving source electrode SE of the driving transistor DT and the first electrode 124 of the light emitting diode LED are electrically connected through the reflection plate RF. However, the driving drain electrode DE of the driving transistor DT and the second electrode 125 of the light emitting diode LED may be electrically connected through the reflection plate RF depending on a type of the driving transistor DT and a design of the pixel circuit PC, but is not limited thereto.

Next, even though it is not illustrated in the drawing, a bank may be disposed on the first connection electrode CE1 and the second connection electrode CE2. The bank may be disposed to be spaced apart from the light emitting diode LED with a predetermined interval and overlaps at least partially the reflection plate RF. For example, the bank may cover a part of the first connection electrode CE1 and the second connection electrode CE2 formed in the contact holes of the third planarization layer 119 and the second planarization layer 118. The bank may be formed of an opaque material to reduce color mixture between the plurality of sub pixels SP and for example, may be formed of black resin, but is not limited thereto.

In the meantime, in order to configure the image to be displayed to have different resolutions, the display device 100 needs to be configured to have different designs according to the resolution so that the manufacturing process of the display device 100 is not unified, which may increase the manufacturing cost. Therefore, in the display device 100 according to the exemplary embodiment of the present disclosure, a display device 100 which displays a high resolution image is used as it is and a low resolution display device 100 may be implemented by not driving only some pixel PX. For example, in the high resolution mode, all the pixels disposed in the plurality of first pixel areas UPA1 and the plurality of second pixel areas UPA2 are driven. Further, in the low resolution mode, pixels of the plurality of first pixel areas UPA1 are driven, but pixels of the plurality of second pixel areas UPA2 are not driven to display the low resolution image. Accordingly, the display device 100 which is designed to display a high resolution image is used as it is to display the low resolution image so that the design of the existing display device 100 for displaying high resolution is used as it is and all the manufacturing processes are unified to reduce the manufacturing cost.

In the meantime, when the display device 100 is driven in a low resolution mode, the number of driven pixels PX is reduced so that the luminance of the display device 100 may be lowered. Therefore, in the display device 100 according to the exemplary embodiment of the present disclosure, in the low resolution mode, a driving current from the pixel circuit PC of the pixel PX of the second pixel area UPA2 which is not driven is supplied to the pixel PX of the first pixel area UPA1. By doing this, luminance of light emitted from each pixel PX is improved. A plurality of welding transistor WT which connects the first pixel area UPA1 and the second pixel area UPA2 is disposed to supply a driving current generated in the pixel PX of the second pixel area UPA2 to the light emitting diode LED of the first pixel area UPA1.

Referring to FIG. 3 to FIG. 5B, a plurality of welding transistors WT is disposed between the first pixel area UPA1 and the second pixel area UPA2. The welding transistor WT may connect each of the plurality of sub pixels SP of the second pixel area UPA2 to each of the plurality of sub pixels SP of the first pixel area UPA1. A driving current generated in each of the plurality of sub pixels SP of the second pixel area UPA2 by the welding transistor WT may be transmitted to each of the plurality of sub pixels SP of the first pixel area UPA1.

The welding transistor WT may connect each of the plurality of sub pixels SP of the first pixel area UPA1 to each of the plurality of sub pixels SP of the second pixel area UPA2. The welding transistor WT may connect reflection plates RF of the sub pixels SP which emit the same color light. For example, one welding transistor WT may connects the first sub pixels SP1 of the first pixel area UPA1 and the second pixel area UPA2 and the other welding transistor WT may connect the second sub pixels SP2 of the first pixel area UPA1 and the second pixel area UPA2.

As described above, the reflection plate RF is connected between the driving transistor DT and the light emitting diode LED so that the driving current from the driving transistor DT may flow to the light emitting diode LED through the reflection plate RF. Therefore, the welding transistor WT is connected to the reflection plate RF through which the driving current flows from the driving transistor DT to transmit the driving current of one sub pixel SP to the other sub pixel SP. For example, a welding source electrode WSE and a welding drain electrode WDE of each of the plurality of welding transistors WT may be connected to the first reflection plate RF1 of the first pixel area UPA1 and the first reflection plate RF1 of the second pixel area UPA2, the second reflection plate RF2 of the first pixel area UPA1 and the second reflection plate RF2 of the second pixel area UPA2. Also, a welding source electrode WSE and a welding drain electrode WDE of each of the plurality of welding transistors WT may be connected to the third reflection plate RF3 of the first pixel area UPA1 and the third reflection plate RF3 of the second pixel area UPA2, and the fourth reflection plate RF4 of the first pixel area UPA1 and the fourth reflection plate RF4 of the second pixel area UPA2. For example, a welding source electrode WSE of one welding transistors WT of the plurality of welding transistors WT may be connected to the first reflection plate RF1 of the second pixel area UPA2, and a welding drain electrode WDE of the one welding transistors WT may be connected to the first reflection plate RF1 of the first pixel area UPA1. For example, a welding source electrode WSE of one welding transistors WT of the plurality of welding transistors WT may be connected to the second reflection plate RF2 of the second pixel area UPA2, and a welding drain electrode WDE of the one welding transistors WT may be connected to the second reflection plate RF2 of the first pixel area UPA1. For example, a welding source electrode WSE of one welding transistors WT of the plurality of welding transistors WT may be connected to the third reflection plate RF3 of the second pixel area UPA2, and a welding drain electrode WDE of the one welding transistors WT may be connected to the third reflection plate RF3 of the first pixel area UPA1. For example, a welding source electrode WSE of one welding transistors WT of the plurality of welding transistors WT may be connected to the fourth reflection plate RF4 of the second pixel area UPA2, and a welding drain electrode WDE of the one welding transistors WT may be connected to the fourth reflection plate RF4 of the first pixel area UPA1*b*, but the present disclosure is not limited thereto.

The welding transistor WT includes a welding active layer WACT, a first welding gate electrode WGE1, a second welding gate electrode WGE2, a welding source electrode WSE, and a welding drain electrode WDE.

First, the first welding gate electrode WGE1 is disposed on the substrate 110 in an area between the first pixel area UPA1 and the second pixel area UPA2. The first welding gate electrode WGE1 may be disposed along a boundary between the first pixel area UPA1 and the second pixel area UPA2. An end portion of the first welding gate electrode WGE1 extends toward a welding control line WCL to be electrically connected to the welding control line WCL. The first welding gate electrodes WGE1 of the plurality of welding transistors WT are connected to each other. Therefore, the first welding gate electrode WGE1 serves as a gate electrode of each of the plurality of welding transistors WT and may also serve as a wiring line which connects each of the plurality of welding transistors WT and the welding control line WCL.

The buffer layer 111 is disposed on the first welding gate electrode WGE1 and the welding active layer WACT is disposed on the buffer layer 111. The welding active layer WACT may be formed of a semiconductor material, such as an oxide semiconductor, amorphous semiconductor, or polycrystalline semiconductor, but is not limited thereto.

The oxide semiconductor material may have an excellent effect of preventing or reducing a leakage current and relatively inexpensive manufacturing cost. The oxide semiconductor may be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto.

The polycrystalline semiconductor material has a fast movement speed of carriers such as electrons and holes and thus has high mobility, and has low energy power consumption and superior reliability. The polycrystalline semiconductor may be made of polycrystalline silicon (poly-Si), but is not limited thereto.

The amorphous semiconductor material may be made of amorphous silicon (a-Si), but is not limited thereto.

The gate insulating layer 112 is disposed on the welding active layer WACT and the second welding gate electrode WGE2 is disposed on the gate insulating layer 112. The second welding gate electrode WGE2 may be electrically connected to the first welding gate electrode WGE1 through a contact hole formed in the gate insulating layer 112 and the buffer layer 111. Therefore, the welding transistor WT may be a transistor with a dual gate structure in which the first welding gate electrode WGE1 and the second welding gate electrode WGE2 are disposed on and below the welding active layer WACT. However, the welding transistor WT may include only any one of the first welding gate electrode WGE1 and the second welding gate electrode WGE2, but is not limited thereto.

Next, the first interlayer insulating layer 113 and the second interlayer insulating layer 114 are disposed on the second welding gate electrode WGE2 and the welding source electrode WSE and the welding drain electrode WDE are disposed on the second interlayer insulating layer 114. One of the welding source electrode WSE and the welding drain electrode WDE is connected to the plurality of reflection plates RF of the first pixel area UPA1 and the other one may be connected to the plurality of reflection plates RF of the second pixel area UPA2, according to a type of the welding transistor WT. For example, when the welding transistor WT is a P-type transistor, the welding source electrode WSE is connected to the reflection plates RF of the second pixel area UPA2 and the welding drain electrode WDE is connected to the reflection plates RF of the first pixel area UPA1. Therefore, the driving current of the second pixel area UPA2 may be transmitted to the first pixel area UPA1. In contrast, when the welding transistor WT is an N-type transistor, the welding source electrode WSE is connected to the reflection plates RF of the first pixel area UPA1 and the welding drain electrode WDE is connected to the reflection plates RF of the second pixel area UPA2. Therefore, the driving current of the second pixel area UPA2 may be transmitted to the first pixel area UPA1.

The welding control line WCL is disposed between the plurality of pixel areas UPA. For example, the welding control line WCL may extend to a column direction between the plurality of pixel areas UPA. The welding control line WCL is a wiring line for applying a control signal to the plurality of welding transistors WT. The welding control line WCL applies a control signal to the first welding gate electrode WGE1 and the second welding gate electrode WGE2 of the welding transistor WT to turn on or turn off the welding transistor WT.

Further, an auxiliary line WCLA may be further disposed to connect the plurality of welding transistors WT and the welding control line WCL. For example, one end of the auxiliary line WCLA is electrically connected to the welding control line WCL and the other end may be connected to the first welding gate electrode WGE1 of the welding transistor WT. However, the first welding gate electrode WGE1 of the welding transistor WT may be directly connected to the welding control line WCL, rather than using the auxiliary line WCLA, but is not limited thereto.

The auxiliary line WCLA may be formed with various shapes. For example, the auxiliary line WCLA may be formed with a rectangular shape with a closed loop structure. However, the auxiliary line WCLA may be configured with various shapes, but is not limited thereto.

Hereinafter, a method for improving a luminance using a welding transistor WT in a low resolution mode will be described with reference to FIG. 6 to FIG. 8.

Figure 6:
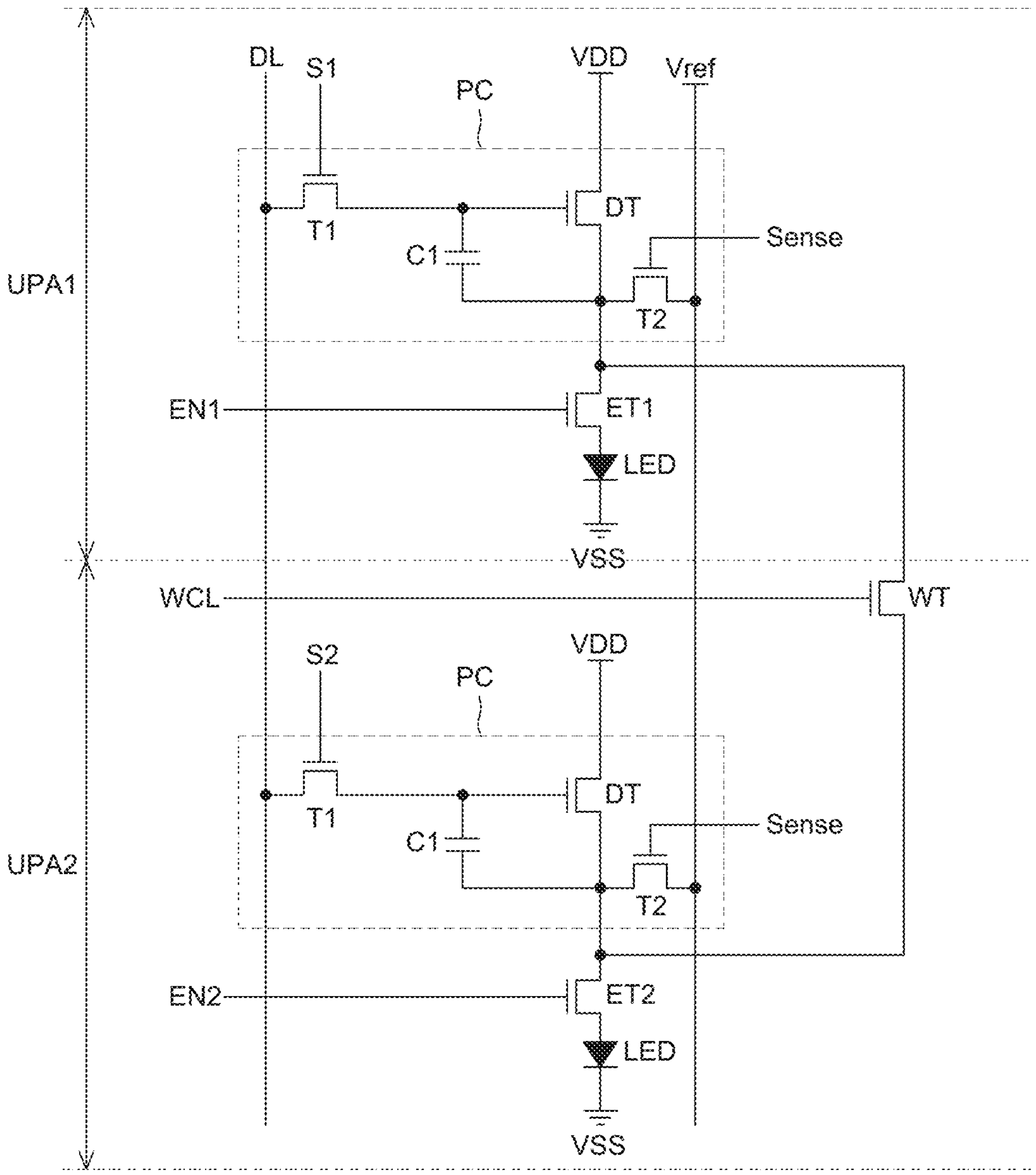
FIG. 6 and FIG. 7 are exemplary circuit diagrams of a pixel circuit of a sub pixel of a display device according to an exemplary embodiment of the present disclosure.
Figure 7:
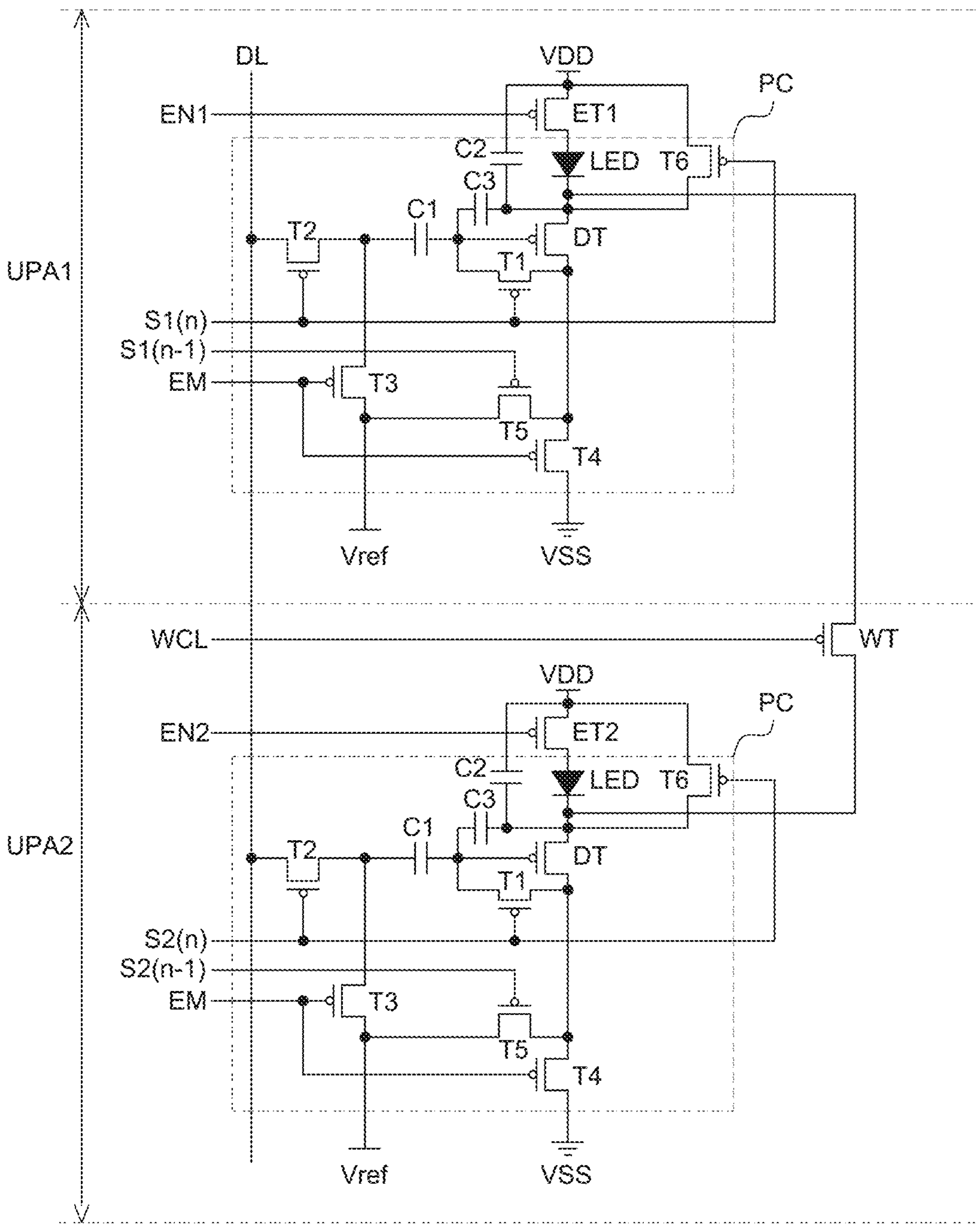

FIG. 6 and FIG. 7 are exemplary circuit diagrams of a pixel circuit of a sub pixel of a display device according to an exemplary embodiment of the present disclosure. FIG. 8 is a driving timing diagram of a display device according to an exemplary embodiment of the present disclosure.

Referring to FIG. 6 and FIG. 7, various pixel circuits PC including a driving transistor DT may be formed in a plurality of sub pixels SP. For example, in the plurality of sub pixels SP, a pixel circuit PC with a 3T1C structure as illustrated in FIG. 6 or a pixel circuit PC with a 7T3C structure as illustrated in FIG. 7 may be disposed. However, the present disclosure is not limited thereto, in the pixel circuit of the present disclosure, various configurations of internal compensation circuits are possible. For example, a number of transistors TFTs in the pixel circuit of the present disclosure may be three or more, and a number of capacitor may be one or more, for example, the pixel circuit of the present disclosure may be a 3T2C pixel circuit including three TFTs and two capacitors, a 5T1C pixel circuit including five TFTs and one capacitor, a 5T2C pixel circuit including five TFTs and two capacitors, a 7T2C pixel circuit including seven TFTs and two capacitors, or the like. Further, the plurality of light emitting diodes LED may be configured with any one of a common cathode structure in which the cathode is commonly connected to the low potential power line VSS or a common anode structure in which the anode is commonly connected to the high potential power line VDD.

For example, referring to FIG. 6, the pixel circuit PC may have a 3T1C structure and the light emitting diode LED may be connected to the pixel circuit PC in a common cathode manner. Further, the pixel circuit PC disposed in each of the sub pixels SP of the first pixel area UPA1 and the second pixel area UPA2 may include a driving transistor DT, a first transistor T1, and a second transistor T2 which are N-type transistors and a first capacitor C1.

The first transistor T1 includes a first gate electrode, a first source electrode, and a first drain electrode. The first drain electrode is connected to the data line DL, the first source electrode is connected to the driving gate electrode GE, and the first gate electrode is connected to a scan line SL. The first transistor T1 of the first pixel area UPA1 is turned by the first scan signal S1 from the scan line SL and the first transistor T1 of the second pixel area UPA2 is turned on by the second scan signal S2 from the scan line SL. The turned-on first transistor T1 transmits a data voltage from the data line DL to the driving gate electrode GE of the driving transistor DT. Accordingly, the first transistor T1 may be referred to as a switching transistor.

The second transistor T2 includes a second gate electrode, a second source electrode, and a second drain electrode. The second drain electrode is connected to a reference line, the second source electrode is connected to a driving source electrode SE, and the second gate electrode is connected to a sensing line. The second transistor T2 is turned on by a sensing signal Sense of the sensing line and transmits a reference voltage Vref from the reference line to the driving source electrode SE of the driving transistor DT.

The driving transistor DT includes a driving gate electrode GE, a driving source electrode SE, and a driving drain electrode DE. The driving drain electrode DE is connected to a high potential power line VDD, the driving source electrode SE is connected to a drain electrode of a first enable transistor ET1 or a second enable transistor ET2, and the driving gate electrode GE is connected to the first transistor T1. The driving transistor DT may control a driving current supplied to the light emitting diode LED.

The first capacitor C1 includes a plurality of capacitor electrodes. Some of the plurality of capacitor electrodes is connected to the driving gate electrode GE and the others may be connected to the driving source electrode SE. The first capacitor C1 constantly maintains the voltage of the driving gate electrode GE to supply a constant driving current to the light emitting diode LED.

The light emitting diode LED includes an anode and a cathode. For example, the first electrode 124 of the light emitting diode LED which is connected to the first semiconductor layer 121 doped with an n-type impurity is a cathode and the second electrode 125 which is connected to the second semiconductor layer 123 doped with a p-type impurity may be an anode. The anode is connected to a source electrode of the first enable transistor ET1 or the second enable transistor ET2 and the cathode may be connected to the low potential power line VSS. The light emitting diode LED of the first pixel area UPA1 is disposed between the first enable transistor ET1 and the lower potential power line VSS and the light emitting diode LED of the second pixel area UPA2 may be disposed between the second enable transistor ET2 and the lower potential power line VSS.

The anode may be formed in a multilayer structure including a transparent conductive layer and an opaque conductive layer having high reflective efficiency. The transparent conductive layer is formed of a material having a relatively large work function value, such as indium-tin-oxide (ITO) or indium-zinc-oxide (IZO), and the opaque conductive layer is formed of a single-layer or multilayer structure containing Al, Ag, Cu, Pb, Mo or Ti, or an alloy thereof. For example, the anode may be formed in a structure in which a transparent conductive layer, an opaque conductive layer, and a transparent conductive layer are sequentially stacked, or in a structure in which a transparent conductive layer and an opaque conductive layer are sequentially stacked. However, embodiments of the present disclosure are not limited thereto.

For example, referring to FIG. 7, the pixel circuit PC may have a 7T3C structure and the light emitting diode LED is connected to the pixel circuit PC in a common anode manner. Further, the pixel circuit PC disposed in each of the sub pixels SP of the first pixel area UPA1 and the second pixel area UPA2 may include a driving transistor DT, a first transistor T1, a second transistor T2, a third transistor T3, a fourth transistor T4, a fifth transistor T5, and a sixth transistor T6, which are P-type transistors. Also, the pixel circuit PC disposed in each of the sub pixels SP of the first pixel area UPA1 and the second pixel area UPA2 may include a first capacitor C1, a second capacitor C2, and a third capacitor C3.

The first transistor T1 includes a first gate electrode, a first source electrode, and a first drain electrode. The first gate electrode is connected to a scan line SL in an n-th row and the first source electrode and the first drain electrode may be connected to the driving gate electrode GE and the driving drain electrode DE of the driving transistor DT, respectively. When a threshold voltage of the driving transistor DT is compensated, the first transistor T1 may connect the driving transistor DT in a diode shape.

The second transistor T2 includes a second gate electrode, a second source electrode, and a second drain electrode. The second gate electrode is connected to a scan line SL in the n-th row, the second source electrode is connected to the data line DL, and the second drain electrode is connected to the first capacitor C1. The second transistor T2 of the first pixel area UPA1 is turned on by the n-th first scan signal S1(*n*) and the second transistor T2 of the second pixel area UPA2 is turned on by the n-th second scan signal S2(*n*) to transmit a data voltage from the data line DL to the first capacitor C1. Accordingly, the second transistor T2 may be referred to as a switching transistor.

The third transistor T3 includes a third gate electrode, a third source electrode, and a third drain electrode. The third gate electrode is connected to an emission control signal EM line and the third source electrode and the third drain electrode are connected to the reference line and the first capacitor C1, respectively. The third transistor T3 is turned on by the emission control signal EM to transmit a reference voltage Vref to the first capacitor C1.

The fourth transistor T4 includes a fourth gate electrode, a fourth source electrode, and a fourth drain electrode. The fourth gate electrode is connected to the emission control signal EM line and the fourth source electrode and the fourth drain electrode are connected to the driving drain electrode DE and the low potential power line VSS, respectively. The fourth transistor T4 is turned on by the emission control signal EM to connect the driving transistor DT and the low potential power line VSS.

The fifth transistor T5 includes a fifth gate electrode, a fifth source electrode, and a fifth drain electrode. The fifth gate electrode is connected to the scan line SL in an n−1-th row and the fifth source electrode and the fifth drain electrode are connected to the reference line and the driving drain electrode DE, respectively. The fifth transistor T5 of the first pixel area UPA1 is turned on by the n−1-th first scan signal S1(*n*−1) and the fifth transistor T5 of the second pixel area UPA2 is turned on by the n−1-th second scan signal S2(*n*−1) to transmit a reference voltage Vref to the driving drain electrode DE.

The sixth transistor T6 includes a sixth gate electrode, a sixth source electrode, and a sixth drain electrode. The sixth gate electrode is connected to the scan line SL in the n-th row, the sixth source electrode is connected to the high potential power line VDD, and the sixth drain electrode is connected to the driving source electrode SE and the cathode of the light emitting diode LED. The sixth transistor T6 of the first pixel area UPA1 is turned on by the n-th first scan signal S1(*n*) and the sixth transistor T6 of the second pixel area UPA2 is turned on by the n-th second scan signal S2(*n*) and the turned-on sixth transistor T6 may transmit a high potential power voltage to the driving source electrode SE and the cathode.

The driving transistor DT includes a driving gate electrode GE, a driving source electrode SE, and a driving drain electrode DE. The driving gate electrode GE is connected to a node between the first capacitor C1 and the third capacitor C3, the driving source electrode SE is connected to the cathode of the light emitting diode LED, and the driving drain electrode DE is connected to a fourth source electrode of the fourth transistor T4.

The first capacitor C1 includes a plurality of capacitor electrodes. Some of the plurality of capacitor electrodes is connected to the driving gate electrode GE and the others may be connected to the second transistor T2. The first capacitor C1 constantly maintains the voltage of the driving gate electrode GE to supply a constant driving current to the light emitting diode LED.

The second capacitor C2 is a capacitor formed between the high potential power line VDD and the third capacitor C3. The second capacitor C2 includes a capacitor electrode connected to the high potential power line VDD and a capacitor electrode connected to the third capacitor C3. The second capacitor C2 increases an intrinsic capacitance in the light emitting diode LED to emit light with higher luminance from the light emitting diode LED.

The third capacitor C3 is a capacitor formed between the first capacitor C1 and the second capacitor C2 and between the driving gate electrode GE and the driving source electrode SE. The third capacitor C3 includes a capacitor electrode connected to the first capacitor C1 and a capacitor electrode connected to the second capacitor C2. The third capacitor C3 which is connected to the first capacitor C1 in series is coupled to the first capacitor C1 and a part of the data voltage from the second drain electrode is transmitted to the driving gate electrode GE according to a capacitance ratio of the first capacitor C1 and the third capacitor C3. Therefore, a transfer rate of the data voltage which is transmitted to the driving gate electrode GE is lowered using the third capacitor C3. Further, when the light emitting diode LED is configured as a micro LED having a large slope of the I-V curve, the transfer rate of the data voltage is lowered using the third capacitor C3 to display more subtle gray scales.

The light emitting diode LED includes an anode and a cathode. The anode is connected to a source electrode of the first enable transistor ET1 or the second enable transistor ET2 and the cathode is connected to the driving transistor DT. The light emitting diode LED of the first pixel area UPA1 is disposed between the first enable transistor ET1 and the driving transistor DT and the light emitting diode LED of the second pixel area UPA2 may be disposed between the second enable transistor ET2 and the driving transistor DT.

Next, a plurality of enable transistors ET1 and ET2 which selectively supplies a driving current to the light emitting diode LED according to a high resolution mode and a low resolution mode may be disposed in each of the plurality of sub pixels SP. For example, the first enable transistor ET1 is connected between the light emitting diode LED and the pixel circuit PC in the sub pixel SP of the first pixel area UPA1 and the second enable transistor ET2 may be connected between the light emitting diode LED and the pixel circuit PC in the sub pixel SP of the second pixel area UPA2. The first enable transistor ET1 is turned on or turned off to selectively supply a driving current to the light emitting diode LED of the first pixel area UPA1. Further, the second enable transistor ET2 is turned on or turned off to selectively supply a driving current to the light emitting diode LED of the second pixel area UPA2.

The first enable transistor ET1 is used to control whether to drive the sub pixel SP of the first pixel area UPA1. The first enable transistor ET1 disposed in the sub pixel SP of the first pixel area UPA1 includes a first enable gate electrode, a first enable source electrode, and a first enable drain electrode.

For example, in a common cathode structure as illustrated in FIG. 6, the first enable source electrode and the first enable drain electrode of the first enable transistor ET1 are connected between the light emitting diode LED and the pixel circuit PC and the first enable gate electrode may be connected to a first enable line EN1. Therefore, the turned-on first enable transistor ET1 connects the pixel circuit PC and the anode of the light emitting diode LED in the first pixel area UPA1 to flow the driving current to the light emitting diode LED.

For example, in the common anode structure as illustrated in FIG. 7, the first enable source electrode and the first enable drain electrode of the first enable transistor ET1 may be connected between the high potential power line VDD and the light emitting diode LED. The turned-on first enable transistor ET1 connects the high potential power line VDD and the light emitting diode LED in the first pixel area UPA1 to flow the driving current to the light emitting diode LED.

The second enable transistor ET2 is used to control whether to drive the sub pixel SP of the second pixel area UPA2. The second enable transistor ET2 disposed in the sub pixel SP of the second pixel area UPA2 includes a second enable gate electrode, a second enable source electrode, and a second enable drain electrode.

For example, in the common cathode structure as illustrated in FIG. 6, the second enable source electrode and the second enable drain electrode of the second enable transistor ET2 are connected between the light emitting diode LED and the pixel circuit PC and the second enable gate electrode may be connected to a second enable line EN2. Therefore, the turned-on second enable transistor ET2 connects the pixel circuit PC and the anode of the light emitting diode LED in the second pixel area UPA2 to flow the driving current to the light emitting diode LED.

For example, in the common anode structure as illustrated in FIG. 7, the second enable source electrode and the second enable drain electrode of the second enable transistor ET2 may be connected between the high potential power line VDD and the light emitting diode LED. The turned-on second enable transistor ET2 connects the high potential power line VDD and the light emitting diode LED in the second pixel area UPA2 to flow the driving current to the light emitting diode LED.

In the meantime, in the drawing, it is illustrated that the first enable transistor ET1 is connected to the light emitting diode LED of the first pixel area UPA1, but the first enable transistor ET1 may be omitted in the first pixel area UPA1 which is always driven in both the high resolution mode and the low resolution mode.

Finally, the welding transistor WT which connects a sub pixel SP of the first pixel area UPA1 and a sub pixel SP of the second pixel area UPA2 is disposed. The welding transistor WT may connect the nodes between the light emitting diodes LED of the first pixel area UPA1 and the second pixel area UPA2 and the driving transistor DT.

Specifically, the welding transistor WT includes a welding gate electrode, a welding source electrode WSE, and a welding drain electrode WDE.

For example, in the common cathode structure in which the N-type transistor is used, as illustrated in FIG. 6, the welding gate electrode is connected to the welding control line WCL. Further, the welding source electrode WSE is connected to the first enable drain electrode of the first enable transistor ET1 which is a driving source electrode SE of the first pixel area UPA1. The welding drain electrode WDE may be connected to the driving source electrode SE and the second enable drain electrode of the second pixel area UPA2. When the welding transistor WT is turned on, the driving current of the second pixel area UPA2 may be transmitted to a node between the driving source electrode SE and the first enable transistor ET1 of the first pixel area UPA1 and a high current may be supplied to the light emitting diode LED.

For example, in the common anode structure in which the P-type transistor is used, as illustrated in FIG. 7, the welding gate electrode is connected to the welding control line WCL. The welding source electrode WSE is connected to a node between the cathode of the light emitting diode LED of the second pixel area UPA2 and the driving transistor DT. The welding drain electrode WDE may be connected to a node between the cathode of the light emitting diode LED and the driving transistor DT of the first pixel area UPA1. When the welding transistor WT is turned on, a driving current path of the second pixel area UPA2 is connected to the light emitting diode LED of the first pixel area UPA1 to flow a high current to the light emitting diode LED of the first pixel area UPA1.

Figure 8:
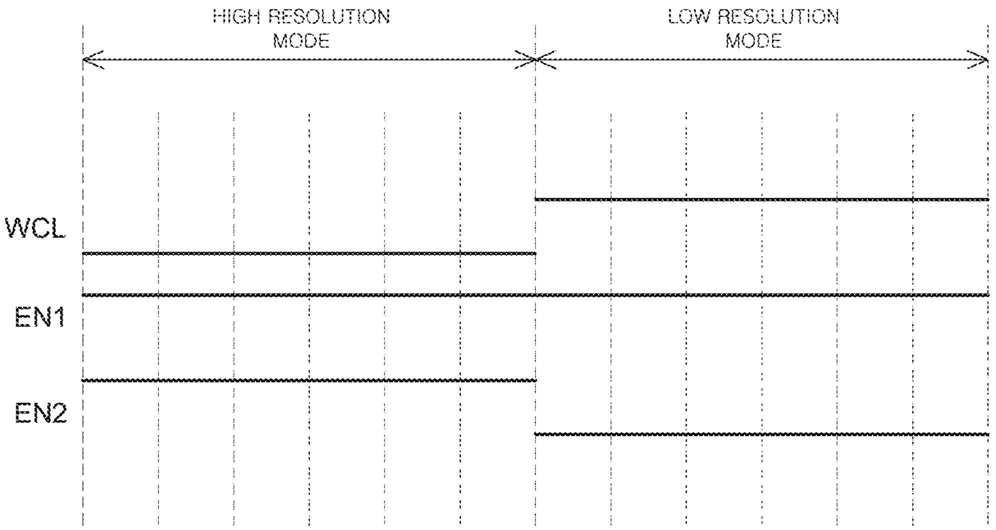
FIG. 8 is a driving timing diagram of a display device according to an exemplary embodiment of the present disclosure.

Referring to FIG. 8, the plurality of enable transistors ET1 and ET2 connected to each pixel circuit PC drives the display device 100 in any one of the high resolution mode and the low resolution mode using the plurality of enable transistors ET1 and ET2 connected to each pixel circuit PC and the welding transistor.

In the high resolution mode, the sub pixels of the plurality of first pixel areas UPA1 and the plurality of second pixel areas UPA2 may be driven. Further, in the low resolution mode, only the sub pixel SP of the plurality of first pixel areas UPA1, among the sub pixels of the plurality of first pixel areas UPA1 and the plurality of second pixel areas UPA2, may be driven, but the sub pixel SP of the plurality of second pixel areas UPA2, among the sub pixels of the plurality of first pixel areas UPA1 and the plurality of second pixel areas UPA2, is not be driven. Further, in the low resolution mode, the driving current generated in the pixel circuit PC of the sub pixel SP of the plurality of second pixel areas UPA2 is supplied to the light emitting diodes LED of the plurality of first pixel areas UPA1 to improve the luminance.

As an example, in the pixel circuit PC of FIG. 6, in the high resolution mode, a turn-off level of voltage is applied to the welding control line WCL. The welding transistor WT is turned off by a turn-off level of voltage from the welding control line WCL and the pixel circuits PC of the first pixel area UPA1 and the second pixel area UPA2 may be separated. The welding transistor WT is turned off to cut off a current path between the pixel circuit PC of the first pixel area UPA1 and the pixel circuit PC of the second pixel area UPA2. Therefore, the driving current generated in the pixel circuit PC of the first pixel area UPA1 is supplied only to the light emitting diode LED of the first pixel area UPA1 and the driving current generated in the pixel circuit PC of the second pixel area UPA2 may be supplied only to the light emitting diode LED of the second pixel area UPA2.

Further, in the high resolution mode, the turn-on level of voltage may be applied to both the first enable line EN1 and the second enable line EN2. The first enable transistor ET1 of the first pixel area UPA1 is turned on by the turn-on level of voltage from the first enable line EN1 and thus, the driving current path between the pixel circuit PC and the light emitting diode LED in the first pixel area UPA1 may be formed. The second enable transistor ET2 of the second pixel area UPA2 is turned on by the turn-on level of voltage from the second enable line EN2 and thus, the driving current path between the pixel circuit PC and the light emitting diode LED in the second pixel area UPA2 may be formed.

Therefore, in the high resolution mode, the welding transistor WT is turned off and the first enable transistor ET1 and the second enable transistor ET2 are turned on to drive both the sub pixel SP of the first pixel area UPA1 and the sub pixel SP of the second pixel area UPA2.

In contrast, in the low resolution mode, the turn-on level of voltage may be applied to the welding control line WCL. The welding transistor WT is turned on by a turn-on level of voltage from the welding control line WCL and the pixel circuit PC of the first pixel area UPA1 and the pixel circuit PC of the second pixel area UPA2 may be connected to each other. The welding transistor WT is turned on to form a current path between the pixel circuit PC of the first pixel area UPA1 and the pixel circuit PC of the second pixel area UPA2. Therefore, the driving current generated in the second pixel area UPA2 which is configured so as not to emit light in the low resolution mode is not supplied to the light emitting diode LED of the second pixel area UPA2 and may be supplied to the light emitting diode LED of the first pixel area UPA1.

Further, in the low resolution mode, the turn-on level of voltage is applied to the first enable line EN1, but the turn-off level of voltage may be applied to the second enable line EN2. The first enable transistor ET1 of the first pixel area UPA1 is turned on by the turn-on level of voltage from the first enable line EN1 and thus, the driving current path between the pixel circuit PC and the light emitting diode LED in the first pixel area UPA1 may be formed. The second enable transistor ET2 of the second pixel area UPA2 may be turned off by the turn-off level of voltage from the second enable line EN2 and thus, the driving current path between the pixel circuit PC and the light emitting diode LED in the second pixel area UPA2 may be cut off. That is, even though the driving current is generated in the pixel circuit PC of the second pixel area UPA2, the driving current may not be supplied to the light emitting diode LED of the second pixel area UPA2.

Therefore, in the low resolution mode, the welding transistor WT and the first enable transistor ET1 are turned on and the second enable transistor ET2 is turned off to operate such that the sub pixel SP of the second pixel area UPA2 does not display an image, but only the sub pixel SP of the first pixel area UPA1 displays an image.

In FIG. 8, it is assumed that the welding transistor WT, the first enable transistor ET1, and the second enable transistor ET2 are N-type transistors as illustrated in FIG. 6 to display a high level of voltage as a turn-on level of voltage and a low level of voltage as a turn-off level of voltage. However, when that the welding transistor WT, the first enable transistor ET1, and the second enable transistor ET2 are P-type transistors as illustrated in FIG. 7, the high level of voltage is used as a turn-off level of voltage and the low level of voltage is used as a turn-on level of voltage to select the high resolution mode and the low resolution mode.

In the meantime, a plurality of display devices 100 according to the exemplary embodiment of the present disclosure are connected to form a tiling display device TD. Therefore, a plurality of display devices 100 having a specific inch and resolution may be connected in accordance with a specification, such as a size and a resolution of the tiling display device TD. However, when the size and the resolution of the tiling display device TD is changed, the display device 100 which configures the tiling display device TD also needs to be designed to have a different specification. However, in the display device 100 according to the exemplary embodiment of the present disclosure, some sub pixels SP are selectively driven to easily adjust a resolution of the display device 100. For example, a plurality of display devices 100 which drives all the sub pixels SP of the plurality of first pixel areas UPA1 and the plurality of second pixel areas UPA2 to operate in a high resolution mode is connected to form a tiling display device TD with a specific resolution. Further, in order to form a tiling display device TD having a resolution lower than the specific resolution, a plurality of display devices 100 which operates in the low resolution mode in which only the sub pixels SP in the plurality of first pixel areas UPA1 are driven, but the sub pixels SP in the plurality of second pixel areas UPA2 are not driven may be connected. Therefore, a tiling display device TD having various specifications may be formed using a display device 100 which adjusts the resolution by selectively driving the plurality of sub pixels SP. Further, there is no need to design the display device 100 again for every tiling display device TD of various models and the design and the process of the display device 100 may be unified to reduce the manufacturing cost and the process time and optimize the process.

In the display device 100 according to the exemplary embodiment of the present disclosure, the plurality of first pixel areas UPA1 and the plurality of second pixel areas UPA2 are selectively driven to display an image in any one of the high resolution mode and the low resolution mode. A resolution may vary depending on a density of pixels PX and the larger the number of pixels PX in the same area, the high resolution of the image to be displayed. Therefore, in the high resolution mode, all the pixels PX included in the display device 100, for example, both a pixel PX of the first pixel area UPA1 and a pixel PX of the second pixel area UPA2 are driven to display a high resolution image. In contrast, in the low resolution mode, only some of the plurality of pixels PX included in the display device 100, for example, pixels in the first pixel area UPA1 are driven to display an image, but not limited thereto, for example, only pixels in the second pixel area UPA2 are driven to display an image. Accordingly, the display device 100 with a specification which is capable of displaying a high resolution image may be used as it is to display a low resolution image. Therefore, there is no need to design and manufacture a new display device 100 having a specification which displays only a low resolution image, but the existing high resolution display device 100 is utilized so that the manufacturing cost and the process time may be reduced.

In the display device 100 according to the exemplary embodiment of the present disclosure, the luminance of the display device 100 may be improved in the low resolution mode. In the low resolution mode, only the pixel PX of the first pixel area UPA1 emits light to display image, but the pixel PX of the second pixel area UPA2 does not emit light. At this time, various signals are applied to the second pixel area UPA2 in the same way to generate a driving current also in the pixel circuit PC of the second pixel area UPA2. The generated driving current flows to the light emitting diode LED of the first pixel area UPA1 to supply a high current to the light emitting diode LED of the first pixel area UPA1. Specifically, the welding transistor WT which connects the pixel circuits PC of the first pixel area UPA1 and the second pixel area UPA2 is formed to transmit a driving current generated in the pixel circuit PC of the second pixel area UPA2 to the first pixel area UPA1. Further, the second enable transistor ET2 is connected to the light emitting diode LED of the second pixel area UPA2 so that the light emitting diode LED of the second pixel area UPA2 may not emit light. In this case, a high current may be supplied to the light emitting diode LED while maintaining the range of various voltages which are applied to the display device to be the same as the related art. Therefore, in the low resolution mode, both a driving current from the pixel circuit PC of the first pixel area UPA1 and a driving current from the pixel circuit PC of the second pixel area UPA2 are supplied to the light emitting diode LED of the first pixel area UPA1. Therefore, the high current is supplied to the light emitting diode LED of the first pixel area UPA1 and the luminance of the display device 100 may be improved.

Figure 9:
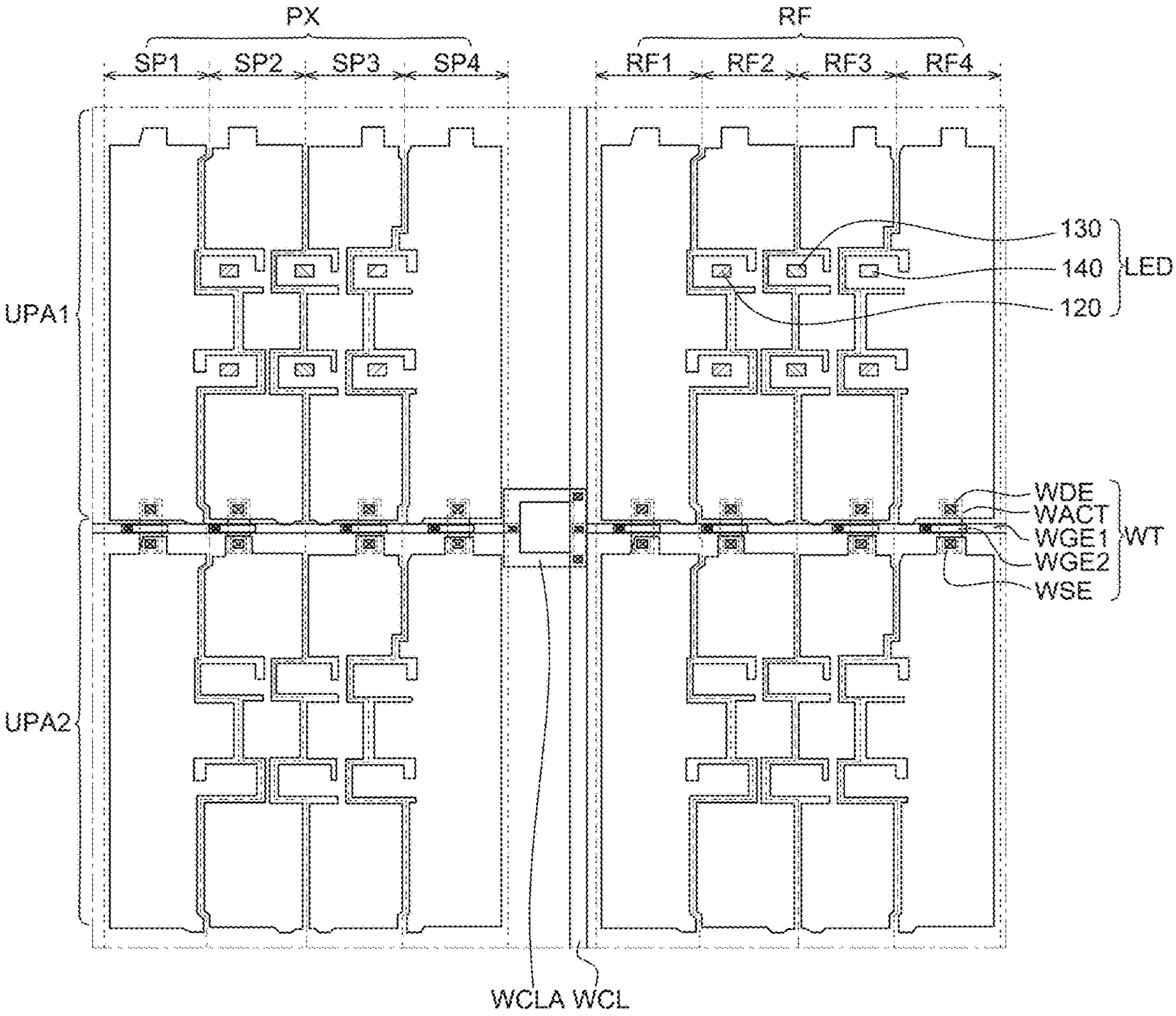
FIG. 9 is an enlarged plan view of a display panel of a display device according to another exemplary embodiment of the present disclosure.
Figure 10:
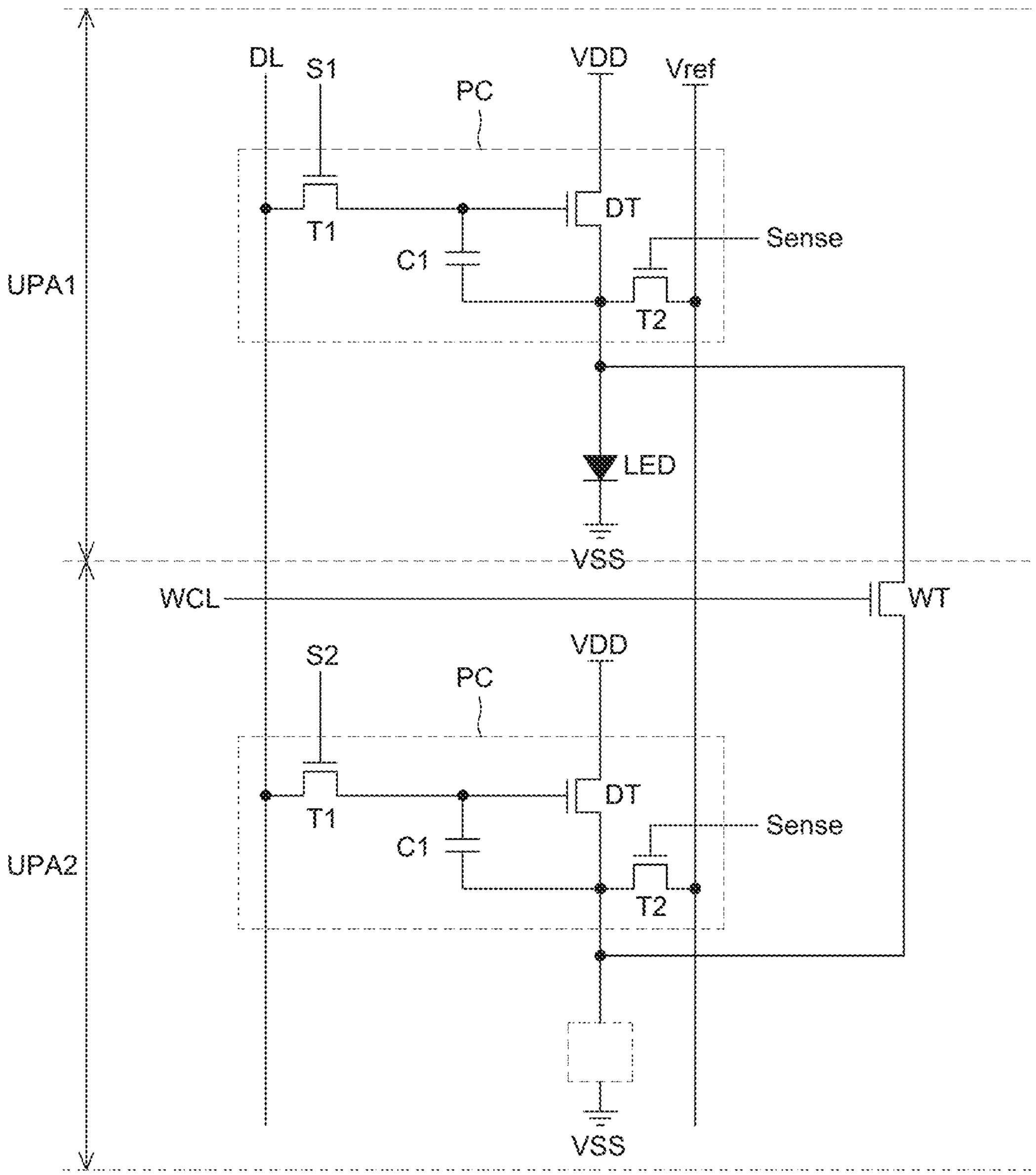
FIG. 10 and FIG. 11 are exemplary circuit diagrams of a pixel circuit of a sub pixel of a display device according to another exemplary embodiment of the present disclosure.
Figure 11:
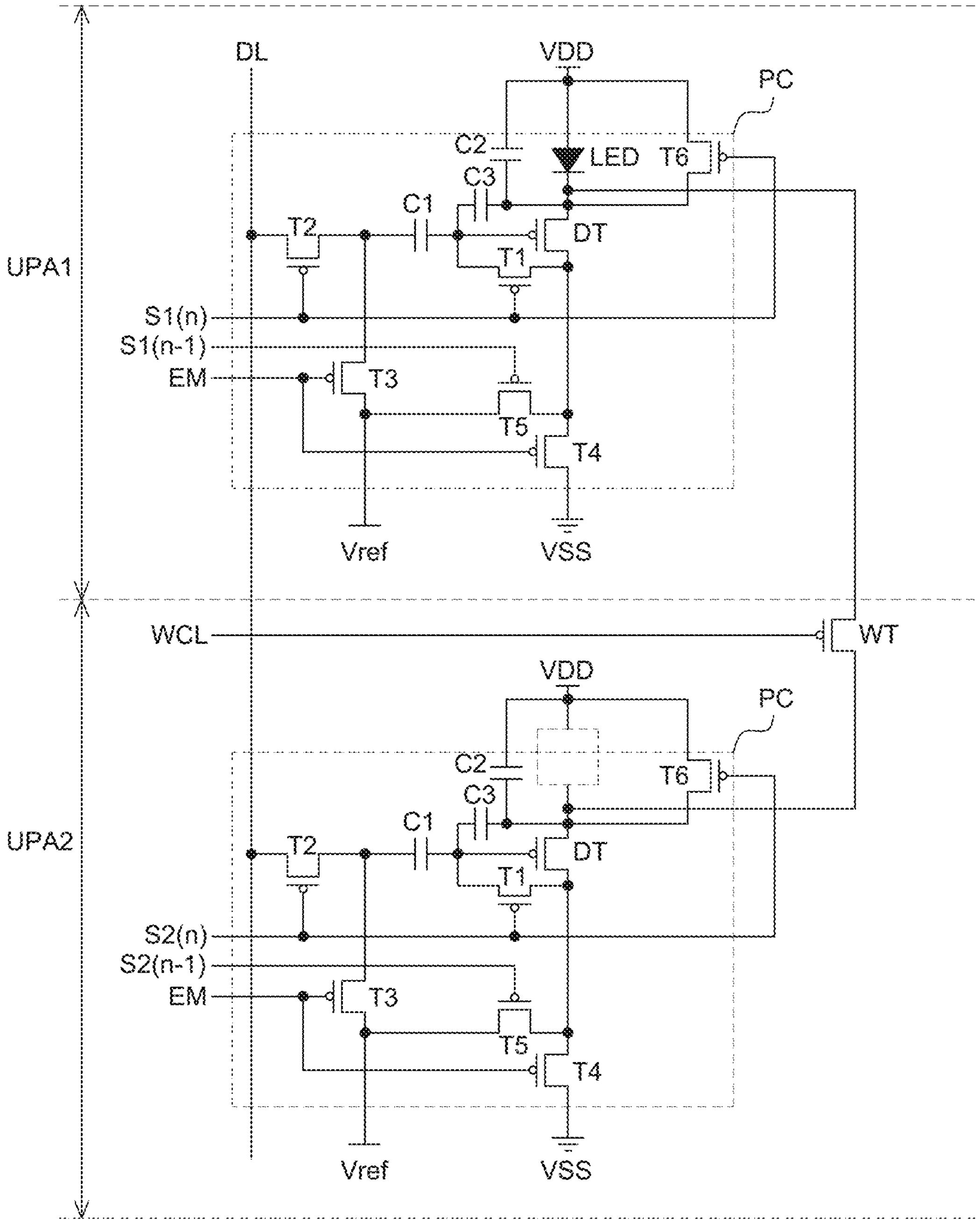
Figure 12:
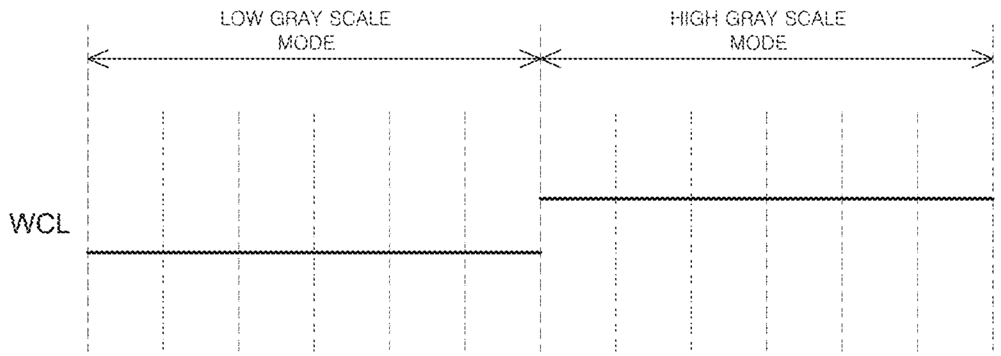
FIG. 12 is a driving timing diagram of a display device according to another exemplary embodiment of the present disclosure.

FIG. 9 is an enlarged plan view of a display panel of a display device according to another exemplary embodiment of the present disclosure. FIG. 10 and FIG. 11 are exemplary circuit diagrams of a pixel circuit of a sub pixel of a display device according to another exemplary embodiment of the present disclosure. FIG. 12 is a driving timing diagram of a display device according to another exemplary embodiment of the present disclosure. A display device 900 of FIG. 9 to FIG. 12 is substantially the same as the display device 100 of FIG. 1 to FIG. 8, except that a light emitting diode LED is not transferred to the second pixel area UPA2 and the first enable transistor ET1 and the second enable transistor ET2 are not disposed. Therefore, a redundant description will be omitted.

Referring to FIG. 9, in the display device 900 in which the plurality of pixel areas UPA is designed based on the high resolution, the light emitting diode LED is transferred to only some of pixel areas UPA to form a display device 900 exclusive for a low resolution mode. For example, after forming the pixel circuit PC, the plurality of reflection plates RF, and the adhesive layer 117 entirely in the plurality of pixel areas UPA, the plurality of light emitting diodes LED is transferred onto the adhesive layer 117. At this time, the light emitting diode LED is transferred to the plurality of first pixel areas UPA1 and the light emitting diode LED is not transferred to the plurality of second pixel areas UPA2. Accordingly, the pixel circuit PC is formed in the plurality of second pixel areas UPA2 but the light emitting diode LED is not transferred so that the light is not emitted. For example, the pixel circuit PC and the light emitting diode LED are provided in the plurality of first pixel areas UPA1, the pixel circuit PC is provided in the plurality of second pixel areas UPA2, but light emitting diode LED is provided in the plurality of second pixel areas UPA2.

Further, the display device 900 according to another exemplary embodiment of the present disclosure may be driven in any one of a low gray scale mode and a high gray scale mode. In the low gray scale mode, the light emitting diode LED is driven only with the pixel circuit PC of the first pixel area UPA1 and in the high gray scale mode, both the pixel circuit PC of the first pixel area UPA1 and the pixel circuit PC of the second pixel area UPA2 are used to drive the light emitting diode LED of the first pixel area UPA1. The gray scale expresses a concentration difference of color by levels and in the low gray scale level, a relatively darker image is displayed and in the high gray scale level, a relatively brighter image may be displayed. Therefore, when an image to be displayed is a low gray scale image, only a driving current from the pixel circuit PC of the first pixel area UPA1 is supplied to the light emitting diode LED to drive the display device 900 in a low gray scale mode. Further, when an image to be displayed is a high gray scale image, all the driving currents from the pixel circuits PC of the first pixel area UPA1 and the second pixel area UPA2 are supplied to the light emitting diode LED so that the light emitting diode LED is supplied with a high current to emit high luminance light. Therefore, the display device 900 may be driven in a high gray scale mode.

For example, referring to FIG. 10, the pixel circuit PC has a 3T1C structure and the light emitting diode LED is connected to the pixel circuit PC in the common cathode manner. At this time, a pixel circuit PC and a light emitting diode LED connected between the pixel circuit PC and the low potential power line VSS are disposed in the sub pixel SP of the first pixel area UPA1. Further, in the sub pixel SP of the second pixel area UPA2, the pixel circuit PC with a 3T1C structure is disposed, but the light emitting diode LED is not disposed.

Further, a welding transistor WT which connects the pixel circuit PC of the first pixel area UPA1 and the pixel circuit PC of the second pixel area UPA2 is disposed. A welding source electrode WSE and a welding drain electrode WDE of the welding transistor WT may be connected to the same node of the pixel circuit PCs of the first pixel area UPA1 and the second pixel area UPA2. The welding source electrode WSE and the welding drain electrode WDE may be connected to the node between the driving transistor DT and the light emitting diode LED. For example, the welding source electrode WSE is connected to the node of the driving source electrode SE of the driving transistor DT of the first pixel area UPA1 and the welding drain electrode WDE is connected to the node of the driving source electrode SE of the driving transistor DT of the second pixel area UPA2. That is, the welding source electrode WSE and the welding drain electrode WDE may be connected to a path between the pixel circuit PC and the light emitting diode LED through which a driving current flows.

As another example, referring to FIG. 11, the pixel circuit PC has a 7T3C structure and the light emitting diode LED is connected to the pixel circuit PC in the common anode manner. At this time, a pixel circuit PC and a light emitting diode LED connected between the pixel circuit PC and the low potential power line VSS are disposed in the sub pixel SP of the first pixel area UPA1. Further, in the sub pixel SP of the second pixel area UPA2, the pixel circuit PC with a 7T3C structure is disposed, but the light emitting diode LED is not disposed.

Further, a welding transistor WT which connects the pixel circuit PC of the first pixel area UPA1 and the pixel circuit PC of the second pixel area UPA2 is disposed. A welding source electrode WSE and a welding drain electrode WDE of the welding transistor WT may be connected to the same node of the pixel circuit PCs of the first pixel area UPA1 and the second pixel area UPA2. The welding source electrode WSE and the welding drain electrode WDE may be connected to the node between the driving transistor DT and the light emitting diode LED. For example, the welding drain electrode WDE is connected to the node of the driving source electrode SE of the driving transistor DT of the first pixel area UPA1 and the welding source electrode WSE may be connected to the node of the driving source electrode SE of the driving transistor DT of the second pixel area UPA2. That is, the welding source electrode WSE and the welding drain electrode WDE may be connected to a path between the pixel circuit PC and the light emitting diode LED through which a driving current flows. Therefore, the welding transistor WT is turned on to transmit the driving current of the pixel circuit PC of the second pixel area UPA2 to the light emitting diode LED of the first pixel area UPA1.

The pixel circuit PC of FIG. 10 will be described as an example. In the low gray scale mode, the welding transistor WT is turned off to separate the pixel circuit PC of the second pixel area UPA2 and the light emitting diodes LED of the first pixel area UPA1. For example, referring to FIG. 10 and FIG. 12, in the low gray scale mode, the turn-off level of voltage is applied to the welding control line WCL to turn off the welding transistor WT. Therefore, the light emitting diode LED of the first pixel area UPA1 is supplied with only the driving current from the pixel circuit PC of the first pixel area UPA1 but not supplied with the driving current from the pixel circuit PC of the second pixel area UPA2 to emit light.

Further, in the high gray scale mode, the welding transistor WT is turned on to connect the pixel circuit PC of the second pixel area UPA2 and the light emitting diode LED of the first pixel area UPA1. For example, referring to FIG. 10 and FIG. 12, in the high gray scale mode, the turn-on level of voltage is applied to the welding control line WCL to turn on the welding transistor WT. Therefore, the light emitting diode LED of the first pixel area UPA1 is supplied with both the driving current from the pixel circuit PC of the first pixel area UPA1 and the driving current from the pixel circuit PC of the second pixel area UPA2 to emit light. That is, the light emitting diode LED of the first pixel area UPA1 is supplied with the high current from the pixel circuit PC of the first pixel area UPA1 and the pixel circuit PC of the second pixel area UPA2 to emit light with a high luminance. Therefore, the display device 900 may easily display a relatively bright high gray scale image.

In the meantime, in FIG. 12, it is assumed that the welding transistor WT is an N-type transistor to represent the high level of voltage as a turn-on level of voltage and the low level of voltage as a turn-off level of voltage. However, when the welding transistor is a P-type transistor as illustrated in FIG. 11, the high level of voltage is used as a turn-off level of voltage and the low level of voltage is used as a turn-on level of voltage to select the high gray scale mode and the low gray scale mode.

In the display device 900 according to another exemplary embodiment of the present disclosure, the display device 900 designed based on the high resolution is used to implement a low resolution display device 900. Specifically, when in the display device 100 in which the plurality of pixel areas UPA is designed based on the high resolution, the light emitting diode LED is transferred, the light emitting diode LED is transferred to only some of pixel areas UPA to form a display device 900 exclusive for a low resolution mode. Therefore, a forming process of a display device 900 exclusive for a high resolution mode and a display device 900 exclusive for a low resolution mode is performed in one process line so that the process is unified. Further, there is no need to design a display device 900 exclusive for a low resolution mode so that the manufacturing cost and the process time are reduced.

In the display device 900 according to another exemplary embodiment of the present disclosure, the pixel circuit PC of the pixel area UPA in which the light emitting diode LED is not transferred is additionally connected to the light emitting diode LED to supply a high current to the light emitting diode LED. A range of a driving current generated in one pixel circuit PC is limited so that it is difficult to implement a predetermined level or higher of a luminance of light which may be emitted from the light emitting diode connected to one pixel circuit. A low gray scale image may be easily displayed, but in order to display a high gray scale image which is relatively bright, a high current needs to be supplied to the light emitting diode LED. Therefore, in the high gray scale mode, the welding transistor WT is used to connect the pixel circuit PC of the second pixel area UPA2 in which the light emitting diode LED is not transferred to the light emitting diode LED of the first pixel area UPA1. The light emitting diode LED is connected to both the pixel circuits PC of the first pixel area UPA1 and the second pixel area UPA2 to be supplied with a high current and emit light with a high luminance. Accordingly, the pixel circuit PC of the pixel area UPA in which the light emitting diode LED is not transferred is temporally connected to the light emitting diode LED in the high gray scale mode to supply a high current to the light emitting diode LED, thereby easily displaying a high gray scale image.

The exemplary embodiments of the present disclosure can also be described as follows:

According to an exemplary embodiment of the present disclosure, a display device includes a display panel in which a plurality of first pixel areas and a plurality of second pixel areas each including a plurality of sub pixels are defined, a pixel circuit which is disposed in each of the plurality of sub pixels and includes a driving transistor, and a welding transistor which selectively connects the pixel circuits of a first pixel area and a second pixel area which are adjacent to each other, among the plurality of first pixel areas and the plurality of second pixel areas.

The welding transistor according to an exemplary embodiment of the present disclosure may be disposed between the pixel circuit of the first pixel area and the pixel circuit of the second pixel area, and may selectively control a connection or disconnection between the pixel circuit of the first pixel area and the pixel circuit of the second pixel area.

The welding transistor according to an exemplary embodiment of the present disclosure may be disposed between the pixel circuit of the first pixel area and the pixel circuit of the second pixel area, and may selectively control the display panel to operate in a high resolution mode or a low resolution mode.

The display device according to an exemplary embodiment of the present disclosure may further include a reflection plate disposed in each of the plurality of sub pixels and electrically connected to the driving transistor of the pixel circuit.

The welding transistor according to an exemplary embodiment of the present disclosure may be disposed between the reflection plate of the first pixel area and the reflection plate of the second pixel area, and may selectively control a connection or disconnection between the reflection plate of the first pixel area and the reflection plate of the second pixel area.

The display device according to an exemplary embodiment of the present disclosure may further include a light emitting diode which is disposed in at least some of the plurality of sub pixels to be connected to the driving transistor of the pixel circuit. A welding source electrode or a welding drain electrode of the welding transistor may be connected to a node between the driving transistor and the light emitting diode.

According to an exemplary embodiment of the present disclosure, in a high resolution mode in which the display panel displays a high resolution image, the light emitting diodes of the plurality of first pixel areas and the light emitting diodes of the plurality of second pixel areas may emit light, and in a low resolution mode in which the display panel displays a low resolution image, the light emitting diodes of the plurality of first pixel areas emits light and the light emitting diodes of the plurality of second pixel areas may not emit light.

The display device according to an exemplary embodiment of the present disclosure may further include a first enable transistor which is disposed in each of the plurality of sub pixels of the plurality of first pixel areas and is connected between the driving transistor and the light emitting diode, and a second enable transistor which is disposed in each of the plurality of sub pixels of the plurality of second pixel areas and is connected between the driving transistor and the light emitting diode. The welding transistor may selectively connect a node between the first enable transistor and the driving transistor and a node between the second enable transistor and the driving transistor.

According to an exemplary embodiment of the present disclosure, a source electrode of the first enable transistor may be connected to a driving drain electrode of the driving transistor, and a drain electrode of the first enable transistor may be connected to an anode of the light emitting diode, and a source electrode of the second enable transistor may be connected to a driving drain electrode of the driving transistor, and a drain electrode of the second enable transistor may be connected to an anode of the light emitting diode.

The display device according to an exemplary embodiment of the present disclosure may further include a first enable transistor which is disposed in each of the plurality of sub pixels of the plurality of first pixel areas and is connected between the light emitting diode and a high potential power line, and a second enable transistor which is disposed in each of the plurality of sub pixels of the plurality of second pixel areas and is connected between the light emitting diode and the high potential power line. The welding transistor may selectively connect a node between the light emitting diode of each of the plurality of sub pixels of the plurality of first pixel areas and the driving transistor and a node between the light emitting diode of each of the plurality of sub pixels of the plurality of second pixel areas and the driving transistor.

According to an exemplary embodiment of the present disclosure, in the low resolution mode, a driving current from the pixel circuits of the plurality of second pixel areas may be supplied to the light emitting diodes of the plurality of first pixel areas.

According to an exemplary embodiment of the present disclosure, in the high resolution mode, the first enable transistor and the second enable transistor may be turned on and the welding transistor is turned off, and in the low resolution mode, the first enable transistor and the welding transistor may be turned on and the second enable transistor is turned off.

According to an exemplary embodiment of the present disclosure, the light emitting diode may be transferred to the plurality of sub pixels of the plurality of first pixel areas, but may not be transferred to the plurality of sub pixels of the plurality of second pixel areas.

In a high gray scale mode in which the display panel displays a high gray scale image, the light emitting diodes of the plurality of first pixel areas may be supplied with a driving current from the pixel circuits of the plurality of first pixel areas and the pixel circuits of the plurality of second pixel areas, and in a low gray scale mode in which the display panel displays a low gray scale image, the light emitting diodes of the plurality of first pixel areas may be supplied with a driving current from the pixel circuits of the plurality of first pixel areas.

In the low gray scale mode, the light emitting diodes of the plurality of first pixel areas are not supplied with a driving current from the pixel circuits of the plurality of second pixel areas.

In the high gray scale mode, the welding transistor may be turned on and may electrically connect an anode of the light emitting diode of the plurality of first pixel areas and the driving transistor of the pixel circuit of the plurality of second pixel areas, and in the low gray scale mode, the welding transistor may be turned off and may separate the anode of the light emitting diode of the plurality of first pixel areas from the driving transistor of the pixel circuit of the plurality of second pixel areas.

According to an exemplary embodiment of the present disclosure, a display device includes a substrate in which a plurality of first pixel areas and a plurality of second pixel areas each including a plurality of sub pixels are defined, a plurality of pixel circuits which is disposed in each of the plurality of sub pixels on the substrate, each of the plurality of pixels including a driving transistor, a plurality of reflection plates which is disposed in each of the plurality of sub pixels on the plurality of pixel circuits and is electrically connected to the driving transistor of each of the plurality of pixel circuits, and a plurality of welding transistors which is disposed between the plurality of first pixel areas and the plurality of second pixel areas, the plurality of welding transistors selectively connecting the plurality of reflection plates of the plurality of first pixel areas and the plurality of reflection plates of the plurality of second pixel areas.

The display device may further include a plurality of light emitting diodes disposed on the plurality of reflection plates in at least some sub pixels of the plurality of sub pixels. Each of the plurality of light emitting diodes may be electrically connected to the driving transistor through each of the plurality of reflection plates.

The plurality of sub pixels may include a first sub pixel, a second sub pixel, a third sub pixel, and a fourth sub pixel. The plurality of reflection plates may include a first reflection plate disposed in the first sub pixel, a second reflection plate disposed in the second sub pixel, a third reflection plate disposed in the third sub pixel, and a fourth reflection plate disposed in the fourth sub pixel. Each of the plurality of welding transistors may connect the first reflection plates of the plurality of first pixel areas and the first reflection plates of the plurality of second pixel areas, the second reflection plates of the plurality of first pixel areas and the second reflection plates of the plurality of second pixel areas, the third reflection plates of the plurality of first pixel areas and the third reflection plates of the plurality of second pixel areas, and the fourth reflection plates of the plurality of first pixel areas and the fourth reflection plates of the plurality of second pixel areas, respectively.

In a high resolution mode, the welding transistor may be turned off and may electrically separate each of the plurality of reflection plates of the plurality of first pixel areas and each of the plurality of reflection plates of the plurality of second pixel areas, and in a low resolution mode, the welding transistor may be turned on and may electrically connect each of the plurality of reflection plates of the plurality of first pixel areas and each of the plurality of reflection plates of the plurality of second pixel areas.

The display device may further include a plurality of first enable transistors connected to the plurality of light emitting diodes of the plurality of first pixel areas, and a plurality of second enable transistors connected to the plurality of light emitting diodes of the plurality of second pixel areas. In the high resolution mode, the plurality of first enable transistors and the plurality of second enable transistors may be turned on to connect a path through which a driving current is supplied to the plurality of light emitting diodes, and in the low resolution mode, the enable transistors disposed in the plurality of second pixel areas may be turned off to separate a path through which the driving current is supplied to the plurality of light emitting diodes of the plurality of second pixel areas.

The plurality of light emitting diodes may be disposed only in the plurality of first pixel areas between the plurality of first pixel areas and the plurality of second pixel areas, in a low gray scale mode, the welding transistor may be turned off to electrically separate each of the plurality of reflection plates of the plurality of first pixel areas and each of the plurality of reflection plates of the plurality of second pixel areas, and in a high gray scale mode, the welding transistor may be turned on to electrically connect each of the plurality of reflection plates of the plurality of first pixel areas and each of the plurality of reflection plates of the plurality of second pixel areas.

The plurality of light emitting diodes are not disposed in the plurality of second pixel areas between the plurality of first pixel areas and the plurality of second pixel areas.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

What is claimed is:

1. A display device, comprising:

a display panel in which a plurality of first pixel areas and a plurality of second pixel areas each including a plurality of sub pixels are defined;

a pixel circuit which is disposed in each of the plurality of sub pixels, the pixel circuit including a driving transistor; and a welding transistor selectively connecting the pixel circuits of the plurality of first pixel areas and the plurality of second pixels areas which are adjacent to each other, among the plurality of first pixel areas and the plurality of second pixel areas, wherein the welding transistor is disposed between the pixel circuit of the first pixel area and the pixel circuit of the second pixel area, and selectively controls the display panel to operate in a high resolution mode or a low resolution mode.

2. The display device according to claim 1, wherein the welding transistor is disposed between the pixel circuit of the first pixel area and the pixel circuit of the second pixel area, and selectively controls a connection or disconnection between the pixel circuit of the first pixel area and the pixel circuit of the second pixel area.

3. The display device according to claim 1, further comprising a reflection plate disposed in each of the plurality of sub pixels and electrically connected to the driving transistor of the pixel circuit.

4. The display device according to claim 3, wherein the welding transistor is disposed between the reflection plate of the first pixel area and the reflection plate of the second pixel area, and selectively controls a connection or disconnection between the reflection plate of the first pixel area and the reflection plate of the second pixel area.

5. The display device according to claim 1, further comprising:

a light emitting diode which is disposed in at least some of the plurality of sub pixels to be connected to the driving transistor of the pixel circuit, wherein a welding source electrode or a welding drain electrode of the welding transistor is connected to a node between the driving transistor and the light emitting diode.

6. The display device according to claim 5, wherein in a high resolution mode in which the display panel displays a high resolution image, the light emitting diodes of the plurality of first pixel areas and the light emitting diodes of the plurality of second pixel areas emit light, and in a low resolution mode in which the display panel displays a low resolution image, the light emitting diodes of the plurality of first pixel areas emits light and the light emitting diodes of the plurality of second pixel areas does not emit light.

7. The display device according to claim 6, further comprising:

a first enable transistor which is disposed in each of the plurality of sub pixels of the plurality of first pixel areas and is connected between the driving transistor and the light emitting diode; and a second enable transistor which is disposed in each of the plurality of sub pixels of the plurality of second pixel areas and is connected between the driving transistor and the light emitting diode, wherein the welding transistor selectively connects a node between the first enable transistor and the driving transistor and a node between the second enable transistor and the driving transistor.

8. The display device according to claim 7, wherein a source electrode of the first enable transistor is connected to a driving drain electrode of the driving transistor, and a drain electrode of the first enable transistor is connected to an anode of the light emitting diode, and wherein a source electrode of the second enable transistor is connected to a driving drain electrode of the driving transistor, and a drain electrode of the second enable transistor is connected to an anode of the light emitting diode.

9. The display device according to claim 6, further comprising:

a first enable transistor which is disposed in each of the plurality of sub pixels of the plurality of first pixel areas and is connected between the light emitting diode and a high potential power line; and a second enable transistor which is disposed in each of the plurality of sub pixels of the plurality of second pixel areas and is connected between the light emitting diode and the high potential power line, wherein the welding transistor selectively connects a node between the light emitting diode of each of the plurality of sub pixels of the plurality of first pixel areas and the driving transistor and a node between the light emitting diode of each of the plurality of sub pixels of the plurality of second pixel areas and the driving transistor.

10. The display device according to claim 9, wherein in the low resolution mode, a driving current from the pixel circuits of the plurality of second pixel areas is supplied to the light emitting diodes of the plurality of first pixel areas.

11. The display device according to claim 9, wherein in the high resolution mode, the first enable transistor and the second enable transistor are turned on and the welding transistor is turned off, and in the low resolution mode, the first enable transistor and the welding transistor are turned on and the second enable transistor is turned off.

12. The display device according to claim 5, wherein the light emitting diode is provided in plurality of sub pixels of the plurality of first pixel areas, but is not provided in the plurality of sub pixels of the plurality of second pixel areas.

13. The display device according to claim 12, wherein in a high gray scale mode in which the display panel displays a high gray scale image, the light emitting diodes of the plurality of first pixel areas are supplied with a driving current from the pixel circuits of the plurality of first pixel areas and the pixel circuits of the plurality of second pixel areas, and in a low gray scale mode in which the display panel displays a low gray scale image, the light emitting diodes of the plurality of first pixel areas are supplied with a driving current from the pixel circuits of the plurality of first pixel areas.

14. The display device according to claim 13, wherein in the low gray scale mode, the light emitting diodes of the plurality of first pixel areas are not supplied with a driving current from the pixel circuits of the plurality of second pixel areas.

15. The display device according to claim 13, wherein in the high gray scale mode, the welding transistor is turned on to electrically connect an anode of the light emitting diode of the plurality of first pixel areas and the driving transistor of the pixel circuit of the plurality of second pixel areas, and in the low gray scale mode, the welding transistor is turned off to disconnect the anode of the light emitting diode of the plurality of first pixel areas from the driving transistor of the pixel circuit of the plurality of second pixel areas.

16. The display device according to claim 12, wherein the plurality of light emitting diodes is not disposed in the plurality of second pixel areas between the plurality of first pixel areas and the plurality of second pixel areas.

17. A display device, comprising:

a substrate in which a plurality of first pixel areas and a plurality of second pixel areas each including a plurality of sub pixels are defined;

a plurality of pixel circuits which is disposed in each of the plurality of sub pixels on the substrate and includes a driving transistor;

a plurality of reflection plates which is disposed in each of the plurality of sub pixels on the plurality of pixel circuits and is electrically connected to the driving transistor of each of the plurality of pixel circuits;

a plurality of welding transistors which is disposed between the plurality of first pixel areas and the plurality of second pixel areas and selectively connects the plurality of reflection plates of the plurality of first pixel areas and the plurality of reflection plates of the plurality of second pixel areas; and a plurality of light emitting diodes disposed on the plurality of reflection plates in at least some sub pixels of the plurality of sub pixels, wherein each of the plurality of light emitting diodes is electrically connected to the driving transistor through each of the plurality of reflection plates, wherein the plurality of sub pixels includes a first sub pixel, a second sub pixel, a third sub pixel, and a fourth sub pixel, the plurality of reflection plates includes a first reflection plate disposed in the first sub pixel, a second reflection plate disposed in the second sub pixel, a third reflection plate disposed in the third sub pixel, and a fourth reflection plate disposed in the fourth sub pixel, and each of the plurality of welding transistors connects the first reflection plates of the plurality of first pixel areas and the first reflection plates of the plurality of second pixel areas, the second reflection plates of the plurality of first pixel areas and the second reflection plates of the plurality of second pixel areas, the third reflection plates of the plurality of first pixel areas and the third reflection plates of the plurality of second pixel areas, and the fourth reflection plates of the plurality of first pixel areas and the fourth reflection plates of the plurality of second pixel areas, respectively, wherein the plurality of light emitting diodes are disposed in the plurality of first pixel areas between the plurality of first pixel areas and the plurality of second pixel areas, in a low gray scale mode, the welding transistor is turned off and electrically separates each of the plurality of reflection plates of the plurality of first pixel areas and each of the plurality of reflection plates of the plurality of second pixel areas, and in a high gray scale mode, the welding transistor is turned on and electrically connects each of the plurality of reflection plates of the plurality of first pixel areas and each of the plurality of reflection plates of the plurality of second pixel areas.

18. The display device according to claim 17, wherein in a high resolution mode, the welding transistor is turned off and electrically separates each of the plurality of reflection plates of the plurality of first pixel areas and each of the plurality of reflection plates of the plurality of second pixel areas, and in a low resolution mode, the welding transistor is turned on and electrically connects each of the plurality of reflection plates of the plurality of first pixel areas and each of the plurality of reflection plates of the plurality of second pixel areas.

19. The display device according to claim 18, further comprising:

a plurality of first enable transistors connected to the plurality of light emitting diodes of the plurality of first pixel areas; and a plurality of second enable transistors connected to the plurality of light emitting diodes of the plurality of second pixel areas, wherein in the high resolution mode, the plurality of first enable transistors and the plurality of second enable transistors are turned on and connect a path through which a driving current is supplied to the plurality of light emitting diodes, and in the low resolution mode, the enable transistors disposed in the plurality of second pixel areas are turned off and disconnect a path through which the driving current is supplied to the plurality of light emitting diodes of the plurality of second pixel areas.

* * * * *